(12) United States Patent
Bhat et al.

(10) Patent No.: US 11,671,105 B2
(45) Date of Patent: *Jun. 6, 2023

(54) FREQUENCY TRACKING LOOP USING A SCALED REPLICA OSCILLATOR FOR INJECTION LOCKED OSCILLATORS

(71) Applicant: Cisco Technology, Inc., San Jose, CA (US)

(72) Inventors: Abhishek Bhat, Allentown, PA (US); Romesh Kumar Nandwana, Breinigsville, PA (US); Kadaba Lakshmikumar, Basking Ridge, NJ (US); Pavan Kumar Hanumolu, Champaign, IL (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/720,446

(22) Filed: Apr. 14, 2022

(65) Prior Publication Data

US 2023/0119570 A1   Apr. 20, 2023

Related U.S. Application Data

(63) Continuation of application No. 17/502,512, filed on Oct. 15, 2021, now Pat. No. 11,356,107.

(51) Int. Cl.
*H03L 7/099* (2006.01)
*H03B 5/12* (2006.01)
(Continued)

(52) U.S. Cl.
CPC ............ *H03L 7/099* (2013.01); *H03B 5/124* (2013.01); *H03B 5/1212* (2013.01);
(Continued)

(58) Field of Classification Search
CPC ......... H03L 7/099; H03L 7/085; H03L 7/093; H03B 5/1228; H03B 5/124; H03B 5/1212; H03D 5/00
(Continued)

(56) References Cited

U.S. PATENT DOCUMENTS 6,317,008 B1 * 11/2001 Gabara .................... H03J 3/20
331/25
9,319,052 B2 * 4/2016 Xu .......................... H03L 7/085
(Continued)

OTHER PUBLICATIONS

Yi-Chieh Huang et al., "An 8b Injection-Locked Phase Rotator with Dynamic Multiphase Injection for 28/56/112Gb/s Serdes Application", ISSCC 2019, Session 30, Advanced Wireline Techniques, 30.7, Feb. 20, 2019, 3 pages.
(Continued)

*Primary Examiner* — Arnold M Kinkead
(74) *Attorney, Agent, or Firm* — Edell, Shapiro & Finnan, LLC

(57) ABSTRACT

An accurate replica oscillator-based frequency tracking loop (FTL) is provided. The replica oscillator used in the FTL can be at a lower frequency and therefore can consume much lower power compared to a main oscillator, such as an injection locked oscillator (ILO). The proposed FTL accurately sets the free running frequency of an ILO across process, voltage and temperature (PVT). Techniques are also provided to compensate the gain and offset error between the replica oscillator and the ILO.

20 Claims, 11 Drawing Sheets

(51) Int. Cl.
  *H03L 7/085* (2006.01)
  *H03L 7/093* (2006.01)
  *H03D 5/00* (2006.01)

(52) U.S. Cl.
  CPC ........... *H03B 5/1228* (2013.01); *H03L 7/085* (2013.01); *H03L 7/093* (2013.01); *H03D 5/00* (2013.01)

(58) Field of Classification Search
  USPC .......................... 331/46, 47, 16, 34, 57, 1 A
  See application file for complete search history.

(56) References Cited

U.S. PATENT DOCUMENTS

| | | | |
|---|---|---|---|
| 11,063,595 | B1 | 7/2021 | Zhang et al. |
| 11,356,107 | B1 * | 6/2022 | Bhat .................. H03L 7/24 |
| 2007/0200635 | A1 | 8/2007 | Meltzer |
| 2009/0015340 | A1 | 1/2009 | Dally et al. |
| 2018/0226979 | A1 | 8/2018 | Kim et al. |
| 2019/0363674 | A1 | 11/2019 | Pandita et al. |

OTHER PUBLICATIONS

Wei Deng et al., "A 0.022mm2 970µW Dual-Loop Injection-Locked PLL with −243dB FOM Using Synthesizable All-Digital PVT Calibration Circuits", ISSCC 2013, Session 14, Digital PLLs and Building Blocks, 14.1, Feb. 19, 2013, 3 pages.

Dongseok Shin et al., "A Mixed-Mode Injection Frequency-Locked Loop for Self-Calibration of Injection Locking Range and Phase Noise in 0.13µm CMOS", ISSCC 2016 / Session 2 / RF Frequency Synthesis Techniques / 2.8, Feb. 1, 2016, 3 pages.

Mayank Raj et al., "A Wideband Injection Locked Quadrature Clock Generation and Distribution Technique for an Energy-Proportional 16-32 GB/s Optical Receiver in 28 nm FDSOI CMOS", IEEE Journal of Solid-State Circuits, vol. 51, No. 10, Oct. 2016, 17 pages.

Nahla Tarek Youssef Abouelkheir, "A Clock Multiplier Based on an Injection Locked Ring Oscillator", University of Ottawa, 2020, 142 pages.

Ahmed Musa et al., "A Compact, Low-Power and Low-Jitter Dual-Loop Injection Locked PLL Using All-Digital PVT Calibration", IEEE Journal of Solid-State Circuits, vol. 49, No. 1, Jan. 2014, 11 pages.

* cited by examiner

FREQUENCY TRACKING LOOP USING A SCALED REPLICA OSCILLATOR FOR INJECTION LOCKED OSCILLATORS

CROSS REFERENCE TO RELATED APPLICATION

This application is a continuation of and claims the benefit of priority to U.S. patent application Ser. No. 17/502,512, filed Oct. 15, 2021, the entirety of which applications are incorporated herein by reference.

TECHNICAL FIELD

The present disclosure relates to frequency tracking circuits.

BACKGROUND

High frequency low jitter multi-phase clocks are useful. They can be used to reduce the error due to small timing margins in high data rate wireline systems. In addition, they can reduce the error vector magnitude of modulated signal in wireless systems.

Injection locked oscillators (ILOs) are widely used in clocking circuitries. For example, they are used in: clock multipliers to generate high-frequency low noise clock, phase interpolators to generate multi-phase low noise clocks, phase rotators to correct part per million (PPM) frequency errors in a transceiver, and high-Q filters to improve the total harmonic distortion of an incoming clock.

DESCRIPTION OF EXAMPLE EMBODIMENTS

Overview

Figure 1A:
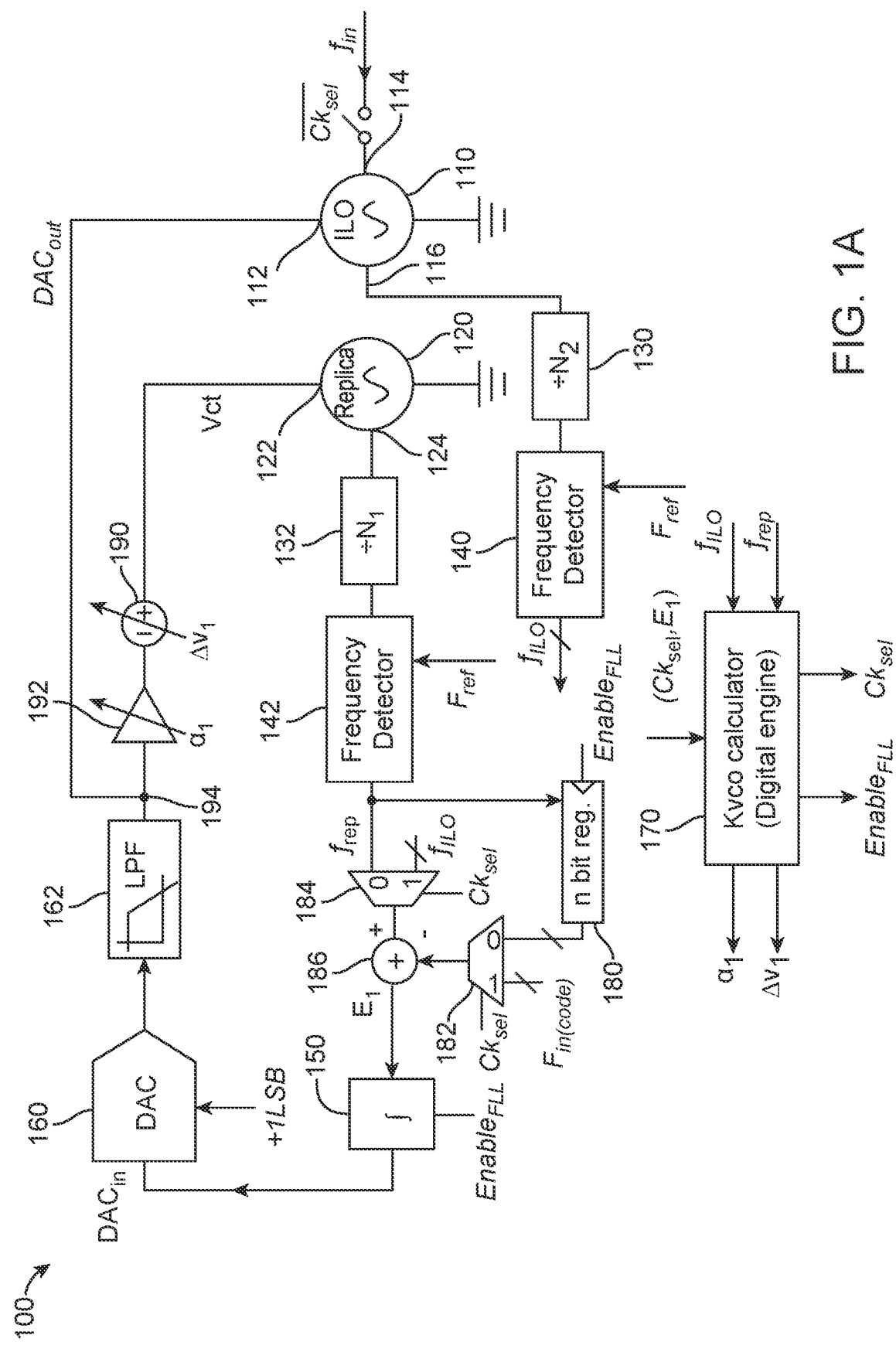
FIG. 1A is a block diagram of a frequency tracking loop (FTL) apparatus having an ILO serving as a main oscillator and a replica oscillator arranged to achieve frequency tracking of the main oscillator across process, voltage and temperature (PVT) variations, according to an example embodiment.

Briefly, a frequency tracking loop (FTL) apparatus is provided that includes a main oscillator and a replica oscillator. The main oscillator, may be an injection locked oscillator, that has a main oscillator control input, an injection input and a main oscillator output, and is configured to provide at the main oscillator output a main oscillator signal at a first frequency based on a control voltage provided at the main oscillator control input. The replica oscillator has a replica oscillator control input and a replica oscillator output, and is configured to provide at the replica oscillator output a replica oscillator signal at a second frequency based on a control voltage provided at the replica oscillator control input. The FTL apparatus further includes a first frequency detector coupled to the main oscillator output and configured to output a main oscillator frequency value that is representative of a frequency of the main oscillator signal, and a second frequency detector coupled to the replica oscillator output and configured to output a replica oscillator frequency value that is representative of a frequency of the replica oscillator signal. Digital logic is provided that is configured to output an error value based on a difference between the main oscillator frequency value and a frequency value representative of a frequency of an injection clock signal provided at the injection input of the main oscillator. An integrator integrates the error value over time to output an integrated error value. A digital-to-analog converter converts the integrated error value to a voltage signal provided at a digital-to-analog converter output that is coupled to the main oscillator control input. Finally, one or more circuit elements are provided, which are coupled between the digital-to-analog converter output and the replica oscillator control input. The one or more circuit elements are configured to adjust a voltage signal or a current signal used to provide the control voltage to the replica oscillator control input that causes the replica oscillator to have an oscillator gain that is exactly scaled with respect to an oscillator gain of the main oscillator, wherein an oscillator gain is a ratio of change in free-running oscillator frequency to change in control voltage.

EXAMPLE EMBODIMENTS

Achieving very low jitter (<100 femtoseconds (fs)) from an injection locked oscillator across process, voltage and temperature (PVT) is very challenging due to the change in free-running frequency with PVT. A robust frequency-tracking loop is useful to accurately track and set the free-running frequency of the ILO.

A phase interpolator (PI) may use four quadrature phase clocks as input and generates an output clock signal with the phase between 0-2π based on N-bit digital control. A digital accumulator is added at the input of the PI control for frequency error compensation. Frequency control is passed to the digital accumulator which generate sawtooth waveforms. The PI translates the digital sawtooth waveforms to provide continuous phase accumulation. By changing the rate of phase accumulation, a PPM level frequency error compensation can be achieved.

In reality, a PI is an inherently non-linear circuit as it uses voltage-to-phase conversion to achieve phase shift on the output. This non-linearity translates into significant phase deviation from an ideal output per quadrant. Overall PI non-linearity and random noise may appear as periodic and random jitter and may add directly to system jitter. Eye margin may be reduced directly by the peak-to-peak values of this periodic noise and random jitter (RJ) added by the PI. In other words, PI non-linearity and noise can lead to jitter, which can degrade eye margin.

Conventional PIs may be replaced with one low-power, dynamic multiphase injection locked (DMIL) oscillator (64-phase, differential coupled ring oscillator). This provides good phase rotation accuracy, linearity (INL) and jitter. A DMIL oscillator performs well only when free-running-frequency is accurately controlled across PVT. For example, INL of the DMIL operating at 14 GHz can increase from as low as 1 picosecond (ps) to 6 to 7 ps, and the RJ can increase from 30 fs to 100 fs, if the free-running frequency is not equal to the injection frequency. In sum, for low jitter and INL, a DMIL oscillator needs an accurate frequency tracking loop.

According to the embodiments presented herein, an accurate replica oscillator-based frequency tracking loop (FTL) is provided. The replica oscillator used in the FTL can be at a lower frequency and therefore can consume much lower power compared to an ILO (main oscillator). The proposed FTL accurately sets the free running frequency of an ILO across PVT. Techniques are also provided to compensate the gain and offset error between the replica oscillator and the ILO.

The FTL presented herein considerably reduces the spurious tones and improves the locking frequency range of an ILO. The frequency pulling between the replica oscillator and the ILO (main oscillator) is reduced considerably as a result of the non-harmonic relationship between the two oscillators. Further still, a digital calibration algorithm is provided that makes the FTL robust and scalable with transistor technology.

Reference is now made to FIG. 1A, which illustrates a block diagram of an FTL 100 according to embodiments presented herein. The FTL 100 includes an ILO (also called main oscillator) 110, a replica oscillator 120, a first frequency divider 130, a second frequency divider 132, a first frequency detector 140, a second frequency detector 142, a digital integrator 150, a digital-to-analog converter (DAC) 160, a low pass filter (LPF) 162 and a Kvco calculator 170 (also called a digital engine or computation circuit).

The ILO 110 has a main oscillator control input 112, a frequency injection input 114 that receives an injection clock signal of frequency $f_{in}$ and a main oscillator output 116. Similarly, the replica oscillator 120 has a replica oscillator control input 122 and a replica oscillator output 124. A control voltage signal Vct is provided to the control input 122 of the replica oscillator 120.

The main oscillator output 116 of the ILO 110 is coupled to the first frequency divider 130 and an output of the first frequency divider 130 is coupled to an input of the first frequency detector 140. The replica oscillator output 124 of the replica oscillator 120 is coupled to the second frequency divider 132 and an output of the second frequency divider 132 is coupled to an input of the second frequency detector 142. A reference frequency value $F_{ref}$ is coupled to the first frequency detector 140 and to the second frequency detector 142. The first frequency divider 130 divides the frequency of the main oscillator signal of the ILO 110 by a divisor $N_2$ to provide a frequency divided main oscillator signal. The second frequency divider 132 divides the frequency of the replica oscillator signal of the replica oscillator 120 by a divisor $N_1$ to provide a frequency divided replica oscillator signal.

The Kvco calculator 170 may be implemented in various ways, such as by a digital logic circuit (formed by appropriately configured digital logic gates) to perform the various computations and control operations described herein. In another form, the Kvco calculator 170 may be implemented by software running on a microprocessor. In still another form, the Kvco calculator may be implemented by a field programmable gate array (FPGA) or an application specific integrated circuit (ASIC). The Kvco calculator 170 may be implemented by any digital logic, computing or control platform, now known or hereinafter developed, and suitable for the embodiments presented herein.

There are other supporting digital logic elements in the FTL 100. Specifically, there is an n-bit register 180, a first multiplexer 182, a second multiplexer 184 and an adder 186. There is also a voltage adjustment element 190 and a gain adjustment element 192 coupled between an output of the LPF 162 and the control input 122 of the replica oscillator 120. The output of the LPF 162 is a (filtered) DAC output ($DAC_{out}$) that is also coupled to the control input 112 of the ILO 110.

The frequency detectors 140 and 142 measure the free-running frequency of the ILO 110 and replica oscillator 120, respectively using a known reference signal of frequency $F_{REF}$. The first frequency detector 140 is configured to measure a frequency of the frequency divided main oscillator signal to produce a main oscillator frequency value, denoted $f_{ILO}$. The second frequency detector 142 is configured to measure a frequency of the frequency divided replica oscillator signal to produce a replica oscillator frequency value, denoted $f_{rep}$.

The first multiplexer 182 has a first (multiple bit) input ("0" input) coupled to the register output of the n-bit register 180, and a second (multiple bit) input ("1" input) coupled to receive a value representative of a frequency, $F_{in}$, of an injection clock signal to be provided to the injection input 114 of the ILO 110. The first multiplexer 182 is configured, based on the select signal $Ck_{sel}$, to provide at a first multiplexer (multiple bit) output, a digital value from the first input (from the n-bit register 180) or a digital value from the second input ($F_{in}$). The second multiplexer 184 has a first (multiple bit) input ("0" input) coupled to receive the replica oscillator frequency value $f_{rep}$ and a second (multiple bit) input ("1" input) coupled to receive the main oscillator frequency value $f_{ILO}$. The second multiplexer 184 is configured, based on the select signal $Ck_{sel}$, to provide at a second multiplexer (multiple bit) output, a digital value from the first input (i.e., the replica oscillator frequency value $f_{rep}$)

or a digital value from the second input (i.e., the main oscillator frequency value $f_{ILO}$).

The inverse of the select signal $Ck_{sel}$ is used to control a switch that selects the injection clock signal $f_{in}$ to the ILO 110. A rising edge of the enable signal called $Enable_{FLL}$ is used to load the output value of the second multiplexer 184 to the n-bit register 180 whose output is coupled to the "0" input of the first multiplexer 182, and to enable operation of the digital integrator 150. The adder 186 comprises a first (multiple bit) input coupled to the output of the first multiplexer 182 and a second (multiple bit) input coupled to the output of the second multiplexer 184. The adder 186 subtracts the output of the first multiplexer 182 from the output of second multiplexer 184 to provide an error value $E_1$ that is supplied as input to the digital integrator 150. The digital integrator 150, in response to the enable signal $Enable_{FLL}$, provides an integrated error value at an integrator output that is coupled to an input of the DAC 160. The digital output of the digital integrator 150 is the DAC input, $DAC_{in}$. In some forms, the adder 186 may be embodied by any suitable digital logic configured to compute a difference between two digital values, e.g., a difference between the main oscillator frequency value and a frequency value representative of a frequency of an injection clock signal provided at the injection input of the ILO 110.

The DAC 160 converts the digital value of $DAC_{in}$, which is a digital code/value, to an analog output voltage that is filtered by the LPF 162 and used as a control voltage input to the ILO 110 and is used to derive a control voltage to the replica oscillator 120. The resolution of the DAC 160 depends on the accuracy requirement of the FTL 100.

The ILO 110 is the main oscillator whose free-running frequency needs to be tracked across PVT and kept constant. The replica oscillator 120 is the second oscillator that operates inside a frequency-locked loop (FLL) to ensure continuous frequency tracking across PVT. A part of the control node of the replica oscillator 120 is connected to the control node of ILO 110. This is shown at reference numeral 194 in FIGS. 1A and 1B. As to the ILO 110, the FLL consists of the path from the main oscillator output 116 through the first frequency divider 130, the first frequency detector 140, the second multiplexer 184 (with the select signal $Ck_{sel}$ set to "1"), the adder 186 that subtracts the digital value representative of the injection frequency $F_{in}$ from the output of the multiplexer 184, the digital integrator 150, the DAC 160, the LPF 162 and connection at the control node 194 to the main oscillator control input 112. As to the replica oscillator 120, the FLL consists of the path from the output 124 of the replica oscillator 120 through the frequency divider 132, the frequency detector 142, the second multiplexer 184 with the select signal $Ck_{sel}$ set to "0", the adder 186 that subtracts the digital value representative of the replica oscillator frequency $f_{rep}$ loaded into the n-bit register from the output value of the multiplexer 184, the digital integrator 150, the DAC 160, the LPF 162 and through the voltage adjustment element 190 and a gain adjustment element 192 to the control input 122 of the replica oscillator 120.

An oscillator gain, Kvco, of a voltage-controlled oscillator, is defined as a ratio of change in free-running oscillator frequency to change in control voltage, $\Delta f_{out}/\Delta V$ in Hz/V. The ILO 110 has an oscillator gain and the replica oscillator 120 has an oscillator gain. As explained herein, the FTL 100 is designed so that the oscillator gain of the replica oscillator 120 is exactly scaled with respect to the oscillator gain of the ILO 110.

As described above, the Kvco calculator 170 may take the form of a digital logic circuit, microprocessor, microcontroller, etc. configured (by hardware configuration or software) to receive as input the main oscillator frequency value $f_{ILO}$, and the replica oscillator frequency value $f_{rep}$, the error value $E_1$, to generate one or more adjustment controls to the one or both of the variable voltage offset element 190 and variable gain element 192 to cause the oscillator gain of the replica oscillator 120 to be exactly scaled with respect to the oscillator gain of the ILO 110. Said another way, the oscillator gain of the replicator oscillator is scaled such that the ratio of their oscillator gains and ratio of their oscillation frequencies are the same. Specifically, the Kvco calculator 170 receives as input $f_{ILO}$ from the first frequency detector 140, $f_{rep}$ from the second frequency detector 142, $Ck_{sel}$, and error value $E_1$, and outputs $Enable_{FLL}$, $Ck_{sel}$, $\alpha_1$, and $\Delta v_1$. $\alpha_1$ is the variable gain value of the variable gain element 192 that operates to change the gain from $DAC_{out}$ to the control voltage Vct of the replica oscillator 120. $\Delta v1$ adds an offset voltage (applied by the variable voltage element 190) to $DAC_{out}$. Only $\alpha_1$ can be changed when the Kvco of the replica oscillator 120 is constant with control voltage Vct, that is, when the Kvco of the replica oscillator 120 is not voltage dependent. Conversely, $\Delta v1$ can be changed when Kvco of the replica oscillator 120 changes with Vct, that is, when the Kvco of the replica oscillator 120 is voltage dependent. Both $\Delta v1$ and $\alpha_1$ can be changed for better control on Kvco of the replica oscillator 120.

Figure 1B:
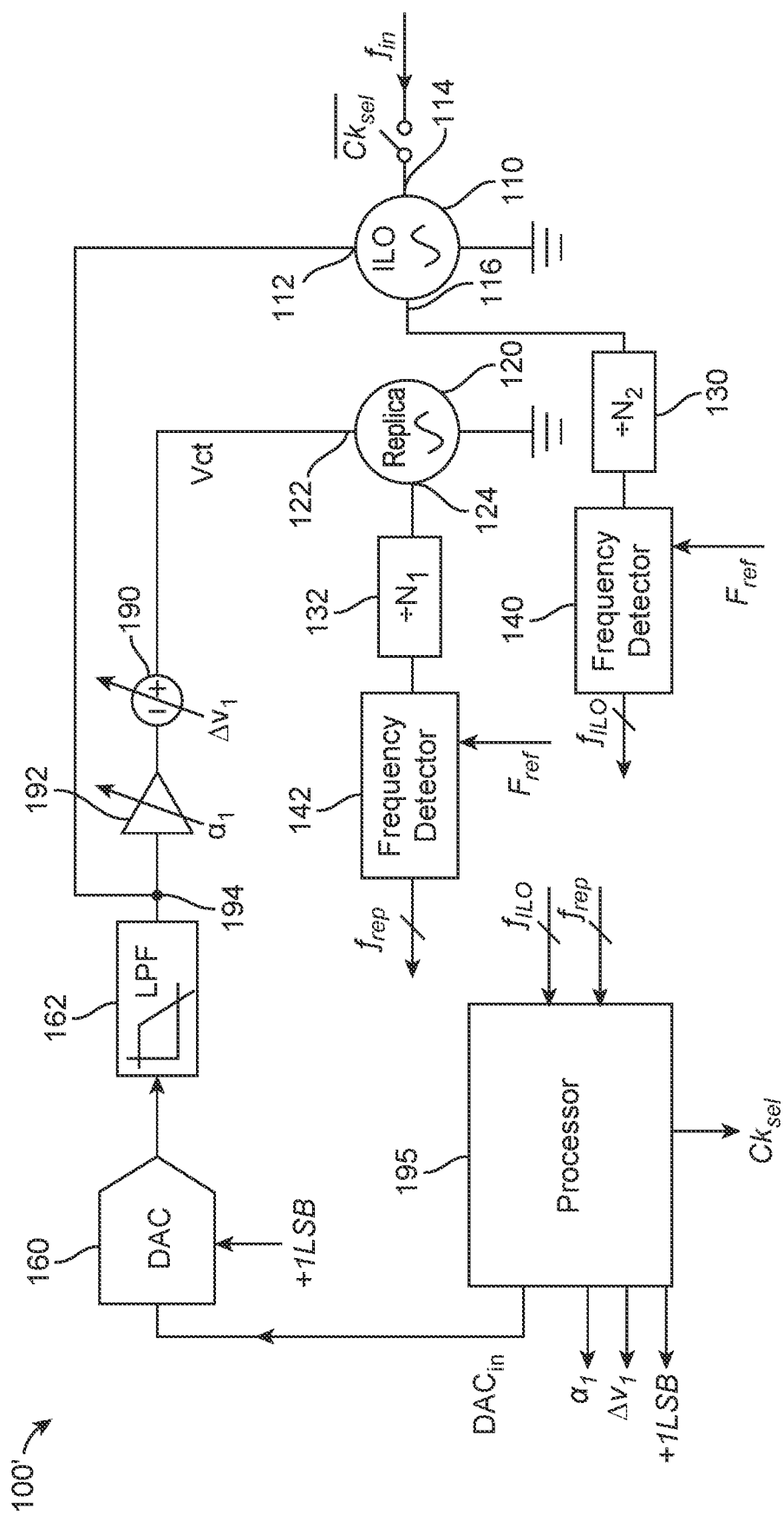
FIG. 1B is a block diagram of an FTL apparatus, similar to FIG. 1A, but using a processor to perform various functions performed by digital logic circuitry in the FTL apparatus of FIG. 1A, according to an example embodiment.

Turning now to FIG. 1B, a diagram is shown of an FTL 100', which is a variation of the FTL 100 shown in FIG. 1A. The FTL 100' is similar to the FTL 100 shown in FIG. 1A, except that much of the hardware digital logic (n-bit register 180, multiplexers 182 and 184, adder 186 and digital integrator 150) and the Kvco calculator 170 are implemented using a processor 195. The processor may be any digital processing device now known or hereinafter developed, such as a microprocessor, microcontroller, an Application Specific Integrated Circuit (ASIC), or Field Programming Gate Array (FPGA). Thus, the processor 195 performs the operations, described herein, of the n-bit register 180, multiplexers 182 and 184, adder 186 and digital integrator 150 and the Kvco calculator 170 shown in FIG. 1A. The inputs to the processor are $f_{ILO}$, and $f_{rep}$. The outputs of the processor 195 are $Ck_{sel}$, $\alpha_1$, $\Delta v_1$, +1LSB and $DAC_{in}$. The processor 195 is configured to generate an error value based on a difference between the main oscillator frequency value and a frequency value representative of a frequency of an injection clock signal provided at the injection input of the main oscillator, and to integrate the error value over time to output an integrated error value ($DAC_{in}$).

Figure 2:
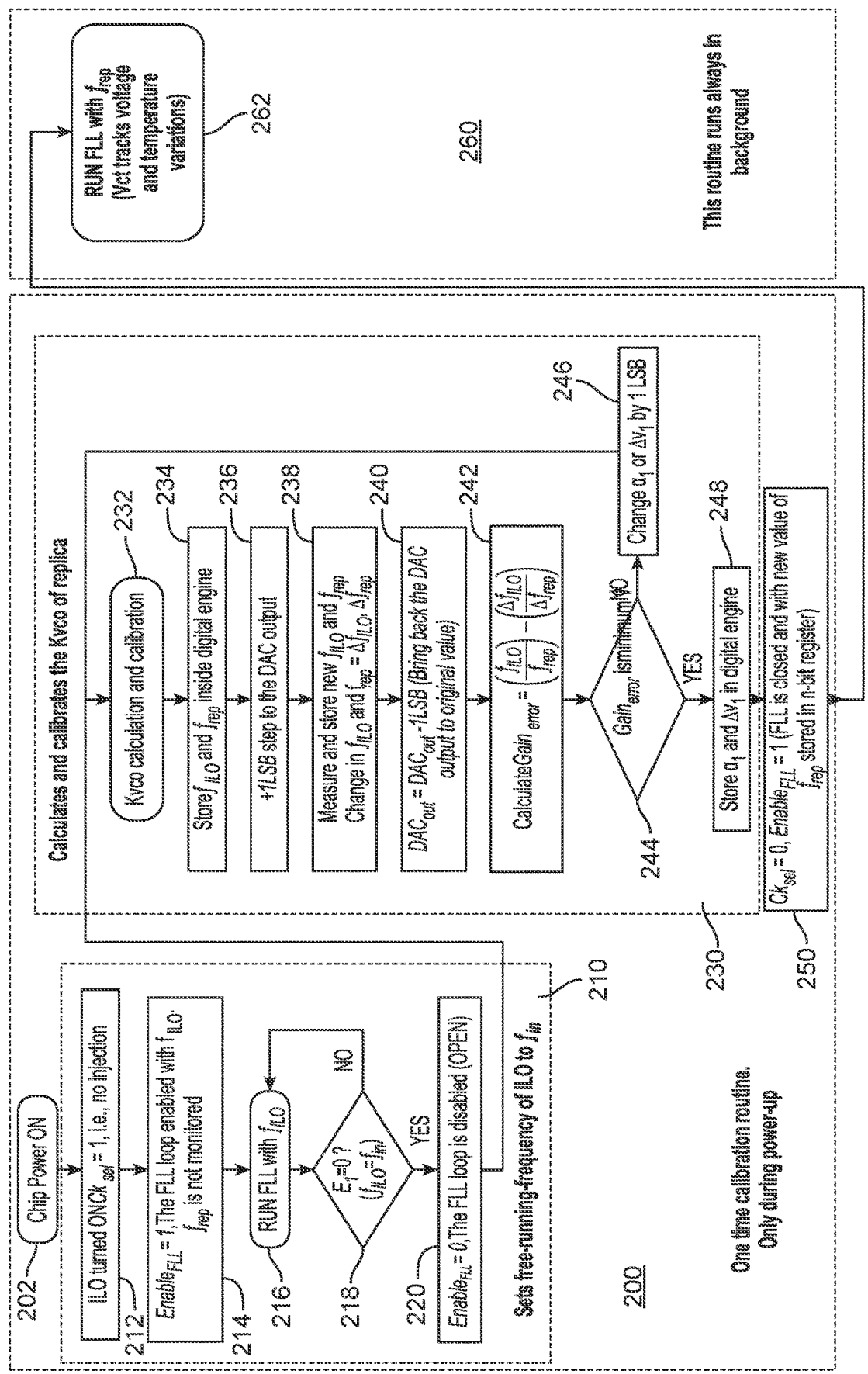
FIG. 2 is a flow chart depicting operation of the FTL apparatus, according to an example embodiment.
Figure 3:
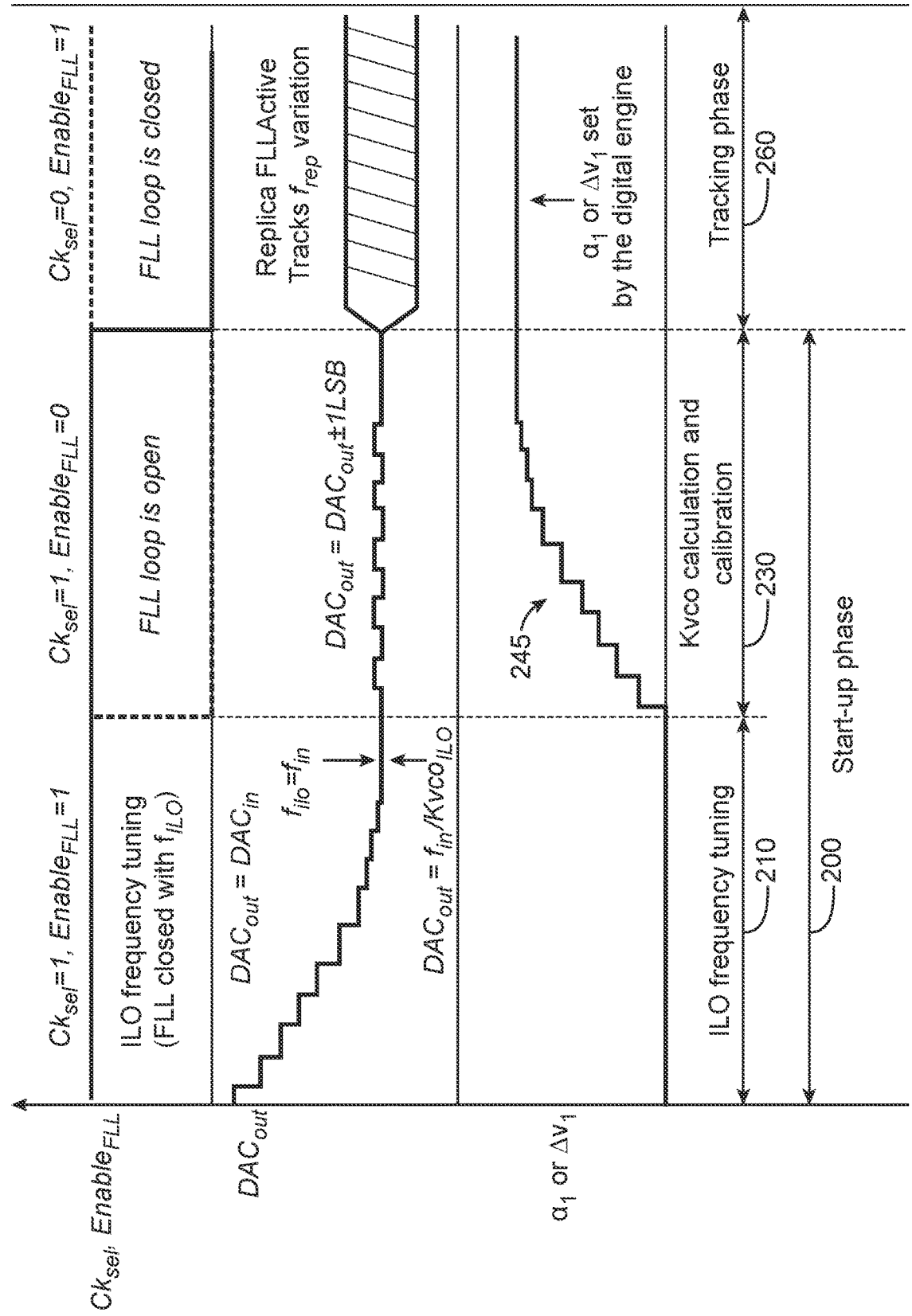
FIG. 3 is a signal timing diagram depicting operation of the FTL apparatus, according to an example embodiment.

Reference is now made to FIGS. 2 and 3, with continued reference to FIGS. 1A and 1B. FIG. 2 shows a flow chart depicting operation of the FTL 100. FIG. 3 is a signal timing diagram showing the example values and timing of various signals during the operational states of the FTL 100.

Operation of the FTL 100 can be separated into two phases: (1) An initialization or start-up phase performed once at power-up; and (2) A tracking phase (normal operation) that follows the initialization or start-up phase. Moreover, the initialization or start-up phase includes an ILO frequency tuning sub-phase followed by a Kvco calculation and calibration sub-phase.

FIGS. 2 and 3 show the initialization or start-up phase is shown at 200 which begins when the device in which the FTL 100 is deployed is powered up, at 202. The ILO frequency tuning sub-phase is shown at 210 and includes steps 212-220 and the Kvco calculation and calibration sub-phase is shown at 230 and includes steps 232-250. Step 250 leads into the tracking phase shown at 260, as described in more detail below.

During the frequency tuning sub-phase 210, free-running-frequency of the ILO is set to $F_{in}$, which is representative of the frequency of an injection clock signal $f_{in}$. At 212, the ILO is turned on and the select signal $Ck_{sel}$ is set to 1. Specifically, at 214, the Kvco calculator 170 initiates the frequency tuning sub-phase by setting the enable signal $Enable_{FLL}$, to 1, thereby enabling the FLL loop with $f_{ILO}$, by enabling operation of the digital integrator 150. The Kvco calculator 170 also sets a value of the select signal $Ck_{sel}$ (to 1) that causes the first multiplexer 182 to provide at the first multiplexer output, the value $F_{in}$ representative of a frequency of an injection clock signal. The setting of the select signal $Ck_{sel}$ (to 1) also causes the second multiplexer 184 to provide at the second multiplexer output, the main oscillator frequency value $f_{ILO}$, to thereby cause the adder 186 to output the error value $E_1$ that, in this configuration/state, is based on a difference between the main oscillator frequency value $f_{ILO}$ and the value representative of the injection frequency $F_{in}$.

During the frequency tuning sub-phase 210, the frequency of the replica oscillator, $f_{rep}$, is not monitored. At 216, the FLL is allowed to run to ensure that the main oscillator frequency $f_{ILO}$ converges to the frequency $F_{in}$ which is the frequency of the injection clock signal $f_{in}$.

While the FLL is running, the integrator 150 integrates the error value $E_1$ output by adder 186, which is supplied as input to the DAC 160. The error value, $E_1$, tracks the difference between the injection frequency $F_{in}$ and the frequency of the ILO 110, $f_{ILO}$. The FLL is designed to work in negative feedback. Hence, the output of the DAC 160 changes in the correct direction to set the control input 112 of the ILO 110, thereby forcing the oscillation frequency of the ILO 110 to be equal to $F_{in}$. The error output $E_1$ will eventually be zero when $f_{in}=f_{ILO}$. Thus, when the Kvco calculator 170 determines that $E_1=0$ at 218, the frequency tuning sub-phase 210 can be completed by setting $Enable_{FLL}$ to zero at 220. This disables (opens) the FLL. Thus, when the error value $E_1$ is equal to zero, indicating that the main oscillator frequency value $f_{ILO}$ is equal to the value representative of the injection frequency, the enable signal $Enable_{FLL}$ is unset (set to 0), to end the frequency tuning phase and start a Kvco calibration phase.

The Kvco calculation and calibration sub-phase 230 now begins at 232. During the calibration sub-phase, the Kvco calculator 170 performs a processing loop consisting of steps 232-246 as now described. At 234, the Kvco calculator (digital engine) 170 stores the values for $f_{ILO}$ and $f_{rep}$. That is, a first storing step 234 is performed that involves storing the main oscillator frequency value $f_{ILO}$ output by the first frequency detector 140 and the replica oscillator frequency value $f_{rep}$ output by the second frequency detector 142.

At 236, the output of the DAC 160 is incremented by 1 least significant bit (+1LSB).

Step 238 involves, after the incrementing step 236, obtaining a new main oscillator frequency value $f_{ILO}$ output by the first frequency detector 140 and a new replica oscillator frequency value $f_{rep}$ output by the second frequency detector 142, as a result of incrementing the output of the DAC 160. The new values for $f_{ILO}$ and $f_{rep}$ are measured and stored by the Kvco calculator 170. Thus, a second storing operation is performed at step 238 to store the new main oscillator frequency value, the new replica oscillator frequency value, a main oscillator change value based on a difference between the new main oscillator frequency value and the main oscillator frequency value (prior to incrementing the DAC 160), and a replica oscillator change value based on a difference between the new replica oscillator frequency value and the replica oscillator frequency value (prior to incrementing the DAC 160).

The changes in values of $f_{ILO}$ and $f_{rep}$ from before and after the LSB increment of the DAC output at 236 are stored as $\Delta f_{ILO}$ and $\Delta f_{rep}$.

At 240, the output of the DAC 160 is returned to its original/previous value prior to the LSB increment.

At 242, an oscillator gain error, $GAIN_{error}$, is computed based on a difference between a first ratio and a second ratio, wherein the first ratio is a ratio of the original main oscillator frequency value (prior to incrementing the DAC 160) to the original replica oscillator frequency value (prior to incrementing the DAC 160), and the second ratio is a ratio of the main oscillator change value to the replica oscillator change value. That is, the $GAIN_{error}$ is computed as $(f_{ILO}/f_{rep})-(\Delta f_{ILO}/\Delta f_{rep})$, where the $(f_{ILO}/f_{rep})$ term is computed based on the values stored at 234 and the $(\Delta f_{ILO}/\Delta f_{rep})$ term is computed at step 238.

Next, at 244, the $GAIN_{error}$ computed at 242 is stored and compared with the previous $GAIN_{error}$ value to determine if it is a desired (minimum possible) value. For the first cycle of this loop, the $GAIN_{error}$ value is not compared with any constant value, rather it is just stored. If it is determined at 244 that the $GAIN_{error}$ is not at a desired minimum value, then at 246 the value for $\alpha_1$ and/or $\Delta v1$ are changed by a predetermined amount (e.g., 1 LSB). Specifically, if the present $GAIN_{error}$ value is greater than the previous $GAIN_{error}$ value, the value of $\alpha_1$ and/or $\Delta v1$ is incremented (or decremented) by 1 LSB. Conversely, if the present $GAIN_{error}$ value is smaller than the previous $GAIN_{error}$ value, the value of $\alpha_1$ and/or $\Delta v1$ is decremented (or incremented) by 1 LSB. This only changes the free-running frequency of the replica oscillator 120. With the change to $\alpha_1$ or $\Delta v1$, the operations of steps 232-244 are repeated. The incremental adjustments to $\alpha_1$ and/or $\Delta v1$ are shown at 245 in FIG. 3 during the Kvco calculation and calibration sub-phase 230. The operations of steps 232-244 continue until it is determined at step 244 that the $GAIN_{error}$ is at a desired minimum value. In other words, the steps 232-244 continues until the numerical value representing the difference between the successive $GAIN_{error}$ crosses zero or changes its sign from positive to negative or vice versa (the derivative or difference between successive values of $GAIN_{error}$ changes signs). Thus, as long as it is determined at step 244 that the oscillator gain error is not at a minimum, the Kvco calculator 170 causes one or more circuit elements to change an offset or a gain of the voltage signal to produce the voltage control signal Vct that is provided to the replica oscillator control input 122.

When the determination is made at step 244 that the oscillator gain error is at the minimum, then at step 248, the value(s) for $\alpha_1$ and/or $\Delta v1$ is/are stored by the Kvco calculator 170. The Kvco calculation and calibration sub-phase 230 is now complete. At 250, the Kvco calculator 170 now sets the enable signal ($Enable_{FLL}=1$) and unsets the select signal ($Ck_{sel}=0$), thereby enabling operation of the integrator 150 and causing the new replica oscillator frequency value $f_{rep}$ from the latest iteration of the processing loop to be stored in the n-bit register 180. In other words, at step 250, $Ck_{sel}$ is set to 0 and $Enable_{FLL}$ is set to 1, causing the FLL to close. The tracking phase 260 now begins.

During the tracking phase 260, the replica oscillator FLL is active and any variations in $f_{rep}$ is tracked. More specifically, at step 262 shown in FIG. 2, the control voltage signal Vct of the replica oscillator 120 tracks any voltage and temperature variations, thereby causing the appropriate adjustments to the control voltage provided in $DAC_{out}$ to the control input 112 of the ILO 110.

The replica oscillator 120 may operate at a fraction of the frequency of the ILO (main oscillator) 110. The voltage offset $\Delta v1$ and/or gain $\alpha_1$ is/are adjusted such that control voltage signal Vct at the control input 122 of the replica oscillator 120 is adjusted. Conventionally, the replica oscillator runs at the same frequency or sub-harmonic of the frequency of the ILO. However, in the FTL 100, the frequency of the replica oscillator 120 can be a different frequency (lower) and a non-sub-harmonic of the frequency of the ILO 110, which avoids or minimizes pulling between the two oscillators.

The processing loop 232-246 is configured to ensure that the gain of the replica oscillator 120 and the gain of the ILO 110 are scaled exactly. During the Kvco calculation and calibration sub-phase 230, when the FLL is open, the offset voltage $\Delta v1$ and/or gain $\alpha_1$ to the control voltage signal Vct is adjusted until the oscillator gain of the replica oscillator 120 and the oscillator gain of the ILO 110 are scaled exactly. By changing the control voltage of the replica oscillator 120, the gain of the replica oscillator 120 can be exactly scaled with respect to the gain of the ILO 110.

Even if a main oscillator and a replica oscillator have a very linear gain, if the gain is not a function of voltage, then the voltage gain stage (variable gain amplifier with variable gain $\alpha_1$) may be used to directly scale the gain of the replica oscillator (since the gain for that special oscillator is not dependent on voltage).

In the variation of the FTL apparatus 100' shown in FIG. 1B, the processor 195 performs the operations depicted in FIG. 2, to generate the digital values of $\alpha_1$ and/or $\Delta v1$ used to control the circuit elements 190 and 192. The processor 195 also outputs the integrated error value that is the input the DAC 160, $DAC_{in}$.

Figure 4:
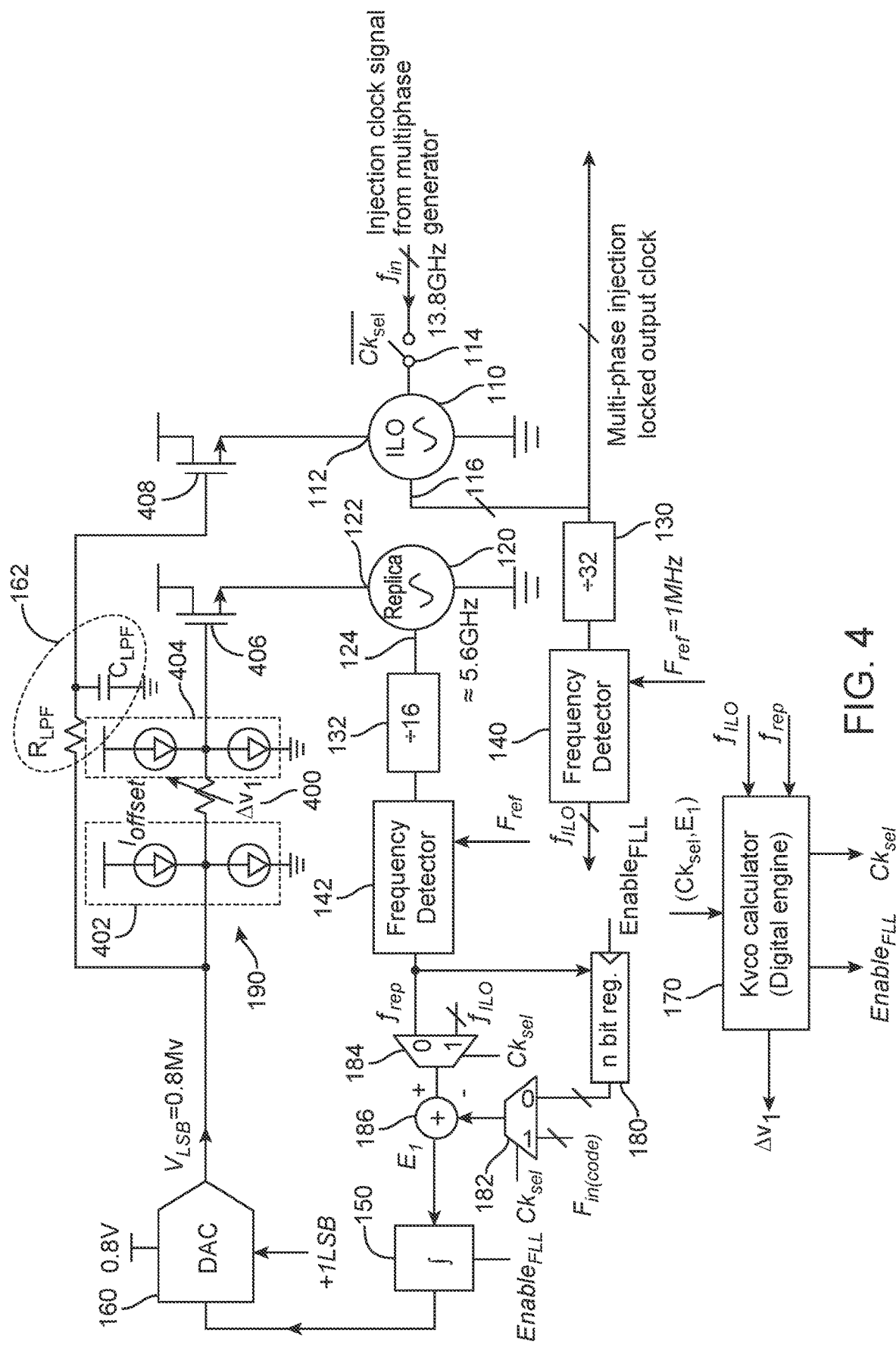
FIG. 4 is a block diagram similar to FIG. 1A, and showing a more specific example implementation of the FTL apparatus, according to an example embodiment.

Reference is now made to FIG. 4. FIG. 4 shows an example implementation of the FTL 100 for a phase interpolator. The FTL 100 is used to track the center frequency of a 13.8 GHz injection locked phase interpolator/rotator (ILPI). A 64-phase, 2-stage coupled ring oscillator may be used in the ILPI. An injection locked multiphase generator or a frequency divider can be used to provide multiple phases of the input clock $f_{in}$. Multiphase injection locked clock output of the ILPI is taken from the outputs 116. The replica oscillator 120 may be, for example, a 5-stage ring VCO that operates at 5.6 GHz. This saves power and reduces frequency pulling between main and replica oscillator when a replica oscillator with a lower operating frequency is used.

As shown in FIG. 4, the value for $N_1$ of the frequency divider 132 is 16 and the value of $N_2$ of the frequency divider 130 is 32. The values for $N_1$ and $N_2$ are chosen based on the frequency detection range of the frequency detectors 140 and 142. The value of $F_{ref}$ is 1 MHz. The DAC 160 outputs a LSB voltage, $V_{LSB}$, of 0.8 mV operating from a supply voltage of 0.8V. The LPF 162 consists of an R-C filter of resistor $R_{LPF}$ and capacitor $C_{LPF}$. The voltage adjustment element 190 consists of a variable resistor 400 and current mirror arrangements 402 and 404 on opposite sides of the variable resistor 400. N-type metal oxide semiconductor (nMOS) transistors 406 and 408 may be used in the supply path to source the current used by the main oscillator 110 and replica oscillator 120, with good power supply rejection. Due to the difference in the voltage controlled oscillator architectures and frequencies of the ILO 110 and replica oscillator 120, the Kvco of the replica may not be scaled exactly, i.e., $f_{in}/f_{rep} \ne Kvco_{ILO}/Kvco_{rep}$.

The control voltage node of the ring VCOs of the replica oscillator 120 and the ILO 110 are the supply voltages of each VCOs. The temperature sensitivity of both the oscillators are found to be very close, but the Kvco's are not scaled exactly, causing some error in the frequency of ILO across PVT.

Figures 5A, 5B:
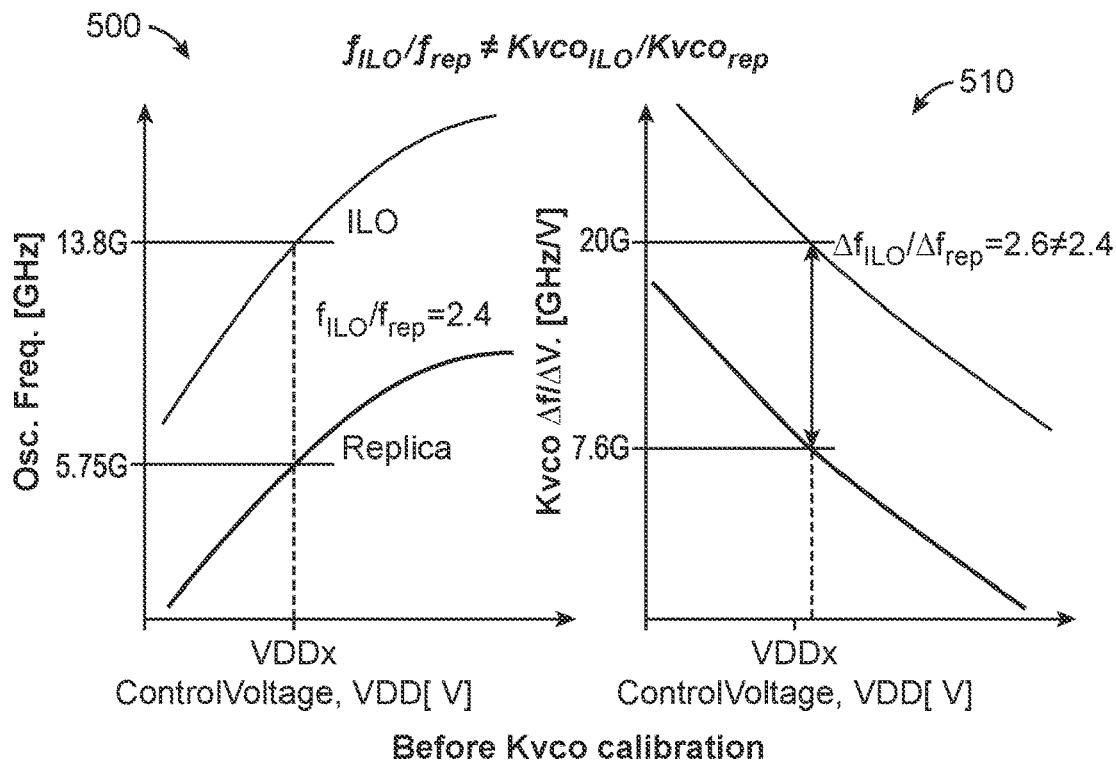
FIG. 5A is a plot of oscillator frequency versus control voltage of the ILO and the replica oscillator, prior to oscillator gain calibration.
FIG. 5B is a plot of oscillator gain versus control voltage for the ILO and the replica oscillator, prior to oscillator gain calibration.

In the example of FIG. 4, the oscillation frequency versus control voltage $V_{DD}$ of the ILO 110 and replica oscillator 120 behave as shown in the plots 500 and 510 of FIGS. 5A and 5B, respectively. Again, when both the ILO 110 and replica oscillator 120 are biased at the same control voltage, their Kvco's are not scaled exactly, i.e., $f_{in}/f_{rep} \ne \Delta f_{ILO}/\Delta f_{rep}$. However, using the techniques presented herein, the Kvco calculator 170 measures the Kvco's and free-running frequency and adjusts the offset voltage $\Delta v1$ such that $(f_{in}/f_{rep}) = (\Delta f_{ILO}/\Delta f_{rep})$.

Figures 5C, 5D:
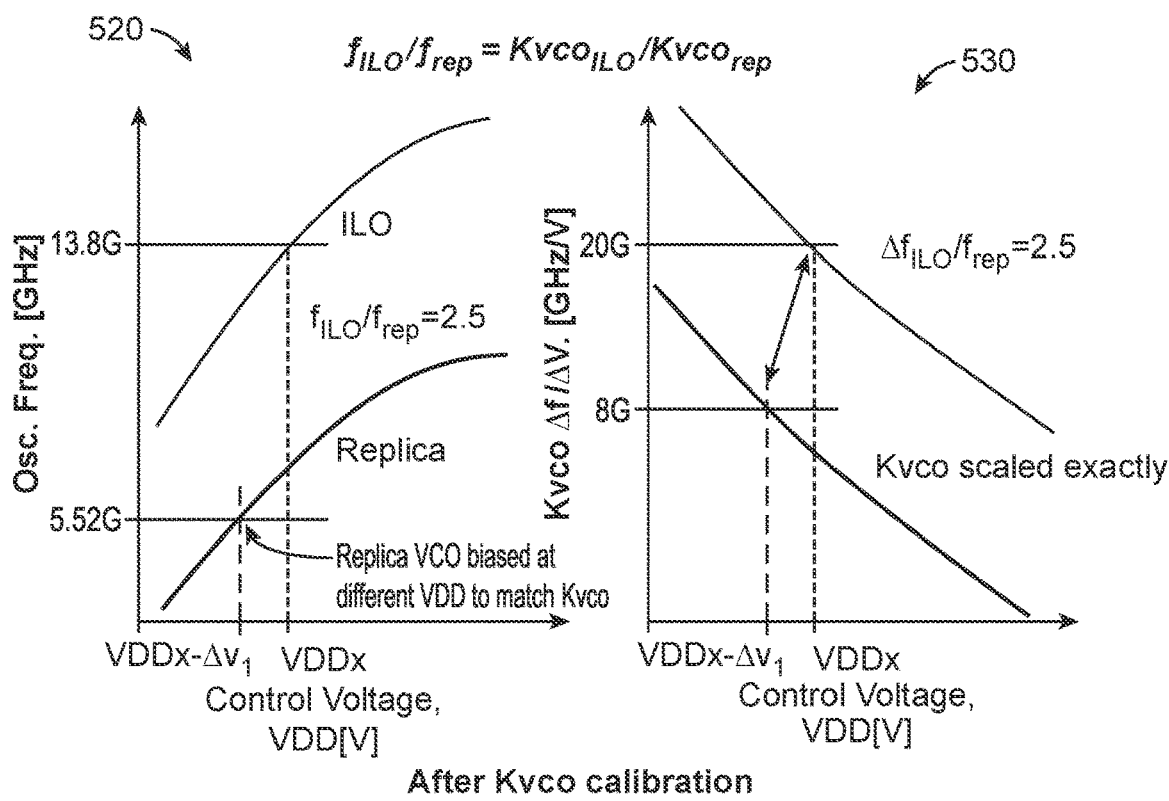
FIG. 5C is a plot of oscillator frequency versus control voltage of the ILO and the replica oscillator, after oscillator gain calibration, according to an example embodiment.
FIG. 5D is a plot of oscillator gain versus control voltage of the ILO and the replica oscillator, after oscillator gain calibration, according to an example embodiment.

FIGS. 5C and 5D show plots 520 and 530, respectively, indicating results of Kvco calibration. As shown in FIG. 5C, the replica oscillator is biased at a different voltage $V_{DD}$ based on the offset voltage $\Delta v1$. The voltage $\Delta v1$ is generated using a current $I_{offset}$ and the variable resistor, as shown in FIG. 4. The digital value/code used to select a particular resistance value of the variable resistor is generated by the Kvco calculator 170 in FIG. 4. This ensures that $f_{in}/f_{rep} = Kvco_{ILO}/Kvco_{rep}$, that is, that the Kvco of the replica oscillator 120 is scaled exactly with respect to the ILO 110, as shown in FIG. 5D. FIG. 5D shows that after Kvco calibration, $\Delta f_{ILO}/\Delta f_{rep} = 2.5 = f_{ILO}/f_{rep}$. Consequently, the control voltage $V_{DD}$ of the ILO 110 will track the voltage and temperature variation using the FLL of the replica oscillator 120.

Figure 6A:
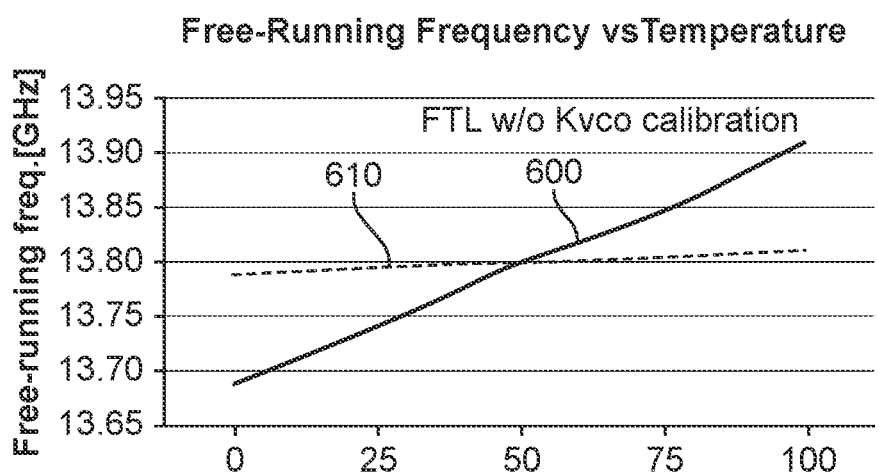
FIG. 6A illustrates a comparison of free-running frequency versus temperature without oscillator gain calibration and with oscillator gain calibration, according to an example embodiment.
Figure 6B:
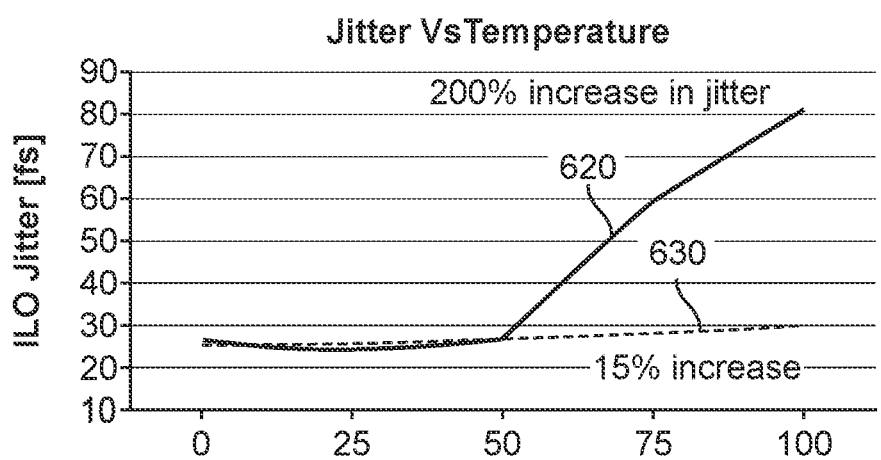
FIG. 6B illustrates a comparison of jitter versus temperature without oscillator gain calibration and with oscillator gain calibration, according to an example embodiment.

Reference is now made to FIGS. 6A and 6B. FIG. 6A shows simulation data for a comparison of the free-running frequency versus temperature of an FTL without Kvco calibration versus an FTL with Kvco calibration as presented herein. Plot 600 shows frequency versus temperature without Kvco calibration. Plot 610 shows frequency versus temperature with Kvco calibration.

Similarly, FIG. 6B shows simulation data for a comparison of jitter versus temperature of an example 13.8 GHz ILPI using an FTL without Kvco calibration versus an FTL with Kvco calibration as presented herein. Plot 620 shows the increase in jitter at the output of an ILPI with temperature for an FTL without Kvo calibration, and plot 630 shows the much milder increase in jitter at the output of an ILPI with temperature for an FTL with Kvco calibration. In generating this simulation data, the FTL is simulated with a 5.6 GHz 5-stage ring oscillator as the replica oscillator and a 64-phase 13.8 GHz ILO or the main oscillator. The ILO consumes 11 mW and the replica oscillator consumes only 1.1 mW.

The 13.8 GHz ILO has a lock range of 500 MHz. Thus, a change in free-running frequency should be minimal for optimum performance (low jitter). The free running frequency changes by ±110 MHz around 50° C. when the Kvco is not calibrated. Using the FTL with Kvco calibration presented herein, the variation reduces to ±12 MHz around 50° C., as shown in FIG. 6A. The jitter variation from 0 to 100 C reduces considerably from 200% to 15% using the FTL with Kvco calibration, as shown in FIG. 6B. Moreover, since the replica oscillator is running at a completely different frequency from the ILO, there will be minimum pulling from the replica oscillator. In sum, using the techniques of the FTL presented herein, the free-running frequency variation with temperature of the ILO reduces by approximately 10×.

Figure 7:
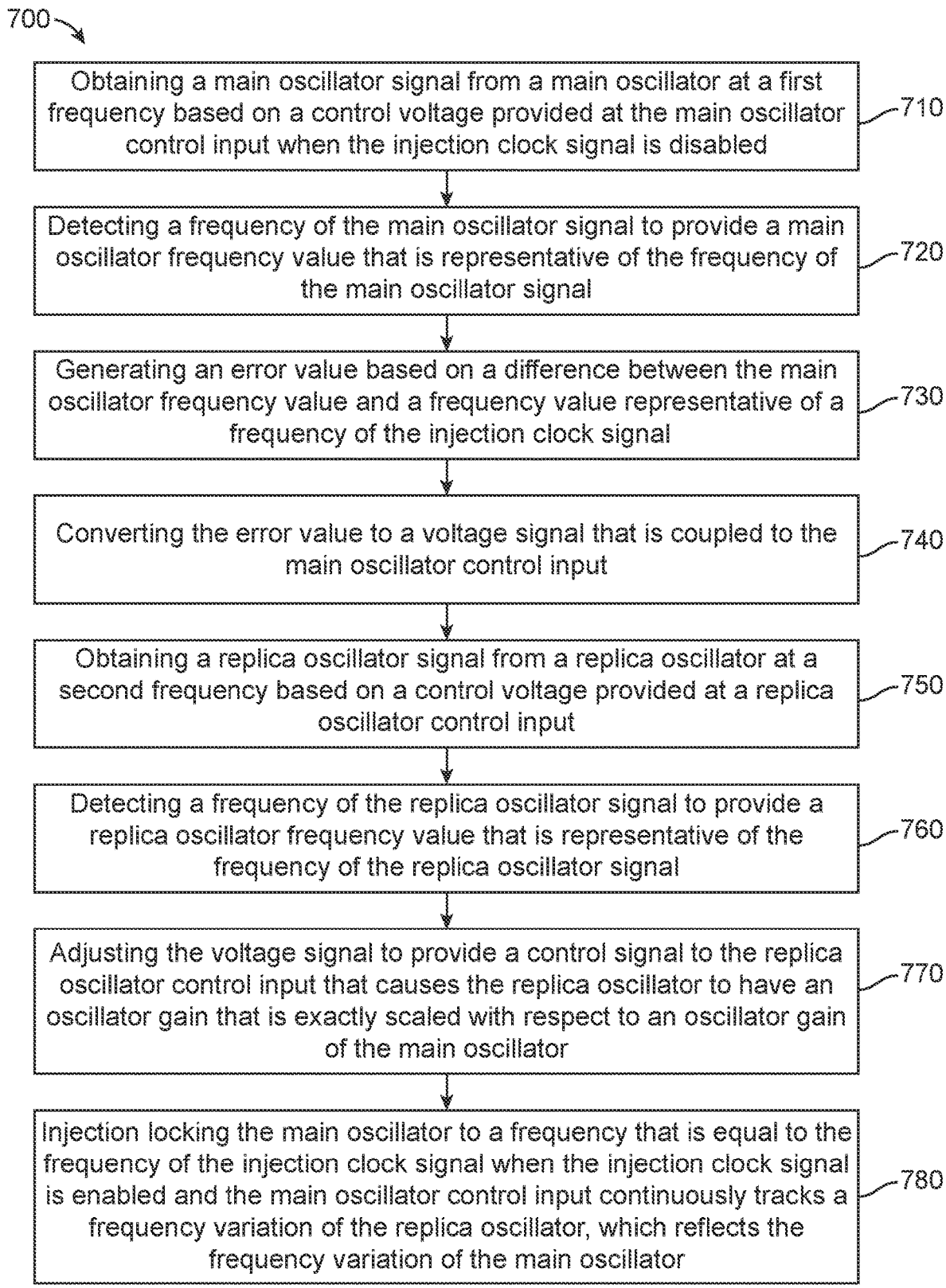
FIG. 7 is a flow chart depicting high-level operation of the FTL apparatus, according to an example embodiment.

Reference is now made to FIG. 7. FIG. 7 shows a flow chart of a method 700 according to an example embodiment. The method 700 includes, at step 710, obtaining a main oscillator signal from a main oscillator at a first frequency based on a control voltage provided at a main oscillator control input, when the injection clock signal to a main oscillator is disabled and at step 720, detecting a frequency of the main oscillator signal to provide a main oscillator frequency value that is representative of the frequency of the main oscillator signal.

At step 730, the method 700 includes generating an error value based on a difference between the main oscillator frequency value and a frequency value representative of the frequency of the injection clock signal provided to the main oscillator. At step 740, the error value is converted to a voltage signal that is coupled to the main oscillator control input.

At step 750, the method includes obtaining a replica oscillator signal from a replica oscillator at a second frequency based on a control voltage provided at a replica oscillator control input. At step 760, the method 700 includes detecting a frequency of the replica oscillator signal to provide a replica oscillator frequency value that is representative of the frequency of the replica oscillator signal.

At step 770, the method 700 includes adjusting the voltage signal to provide a control signal to the replica oscillator control input that causes the replica oscillator to have an oscillator gain that is exactly scaled with respect to an oscillator gain of the main oscillator. Again, an oscillator gain is a ratio of change in free-running oscillator frequency to change in control voltage.

At step 780, the method includes injection locking the main oscillator to a frequency that is equal to the frequency of the injection clock signal when the injection clock signal is enabled, and the main oscillator control input continuously tracks a frequency variation of the replica oscillator, which reflects the frequency variation of the main oscillator.

Figure 8:
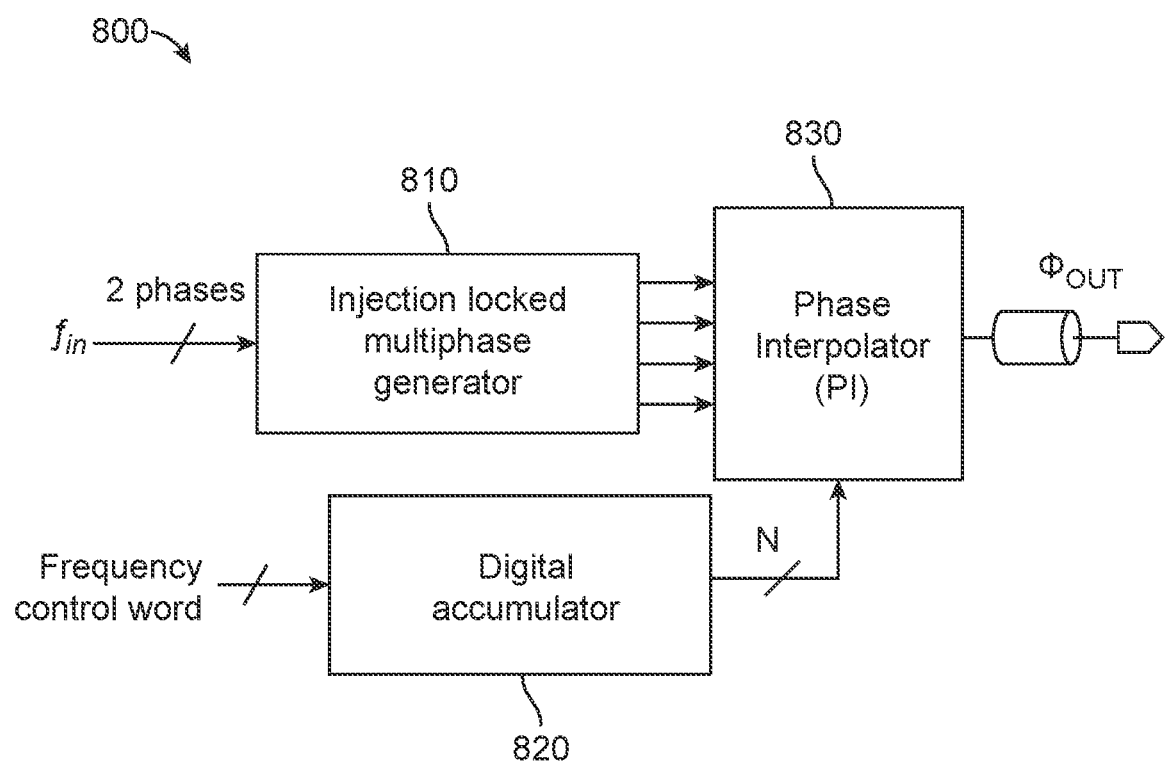
FIG. 8 is a block diagram of a low noise fractional frequency generator system that employs an FTL system inside an injection locked multi-phase clock generator used to provide low noise multi-phase clocks to a phase interpolator, according to an example embodiment.

Reference is now made to FIG. 8, illustrating a low noise fractional frequency generator system 800, as one example use of the FTL 100. The low noise fractional frequency generator system 800 includes an injection locked multiphase generator 810 which uses the FTL 100 described above to accurately set the free-running frequency of the injection locked oscillator used in it, a digital accumulator 820 and a phase interpolator 830. In the ow noise fractional frequency generator system 800, the injection locked multiphase generator 810 provides the clock with quadrature phases as input and the phase interpolator 830 generates an output clock signal with the phase varying between 0-2n based on an N-bit digital control word. The digital accumulator 820 generates sawtooth waves and the phase interpolator 830 translates the digital sawtooth waves to continuous phase accumulation to realize a low noise output clock whose frequency is a fractional multiple of input frequency $f_{in}$.

Figure 9:
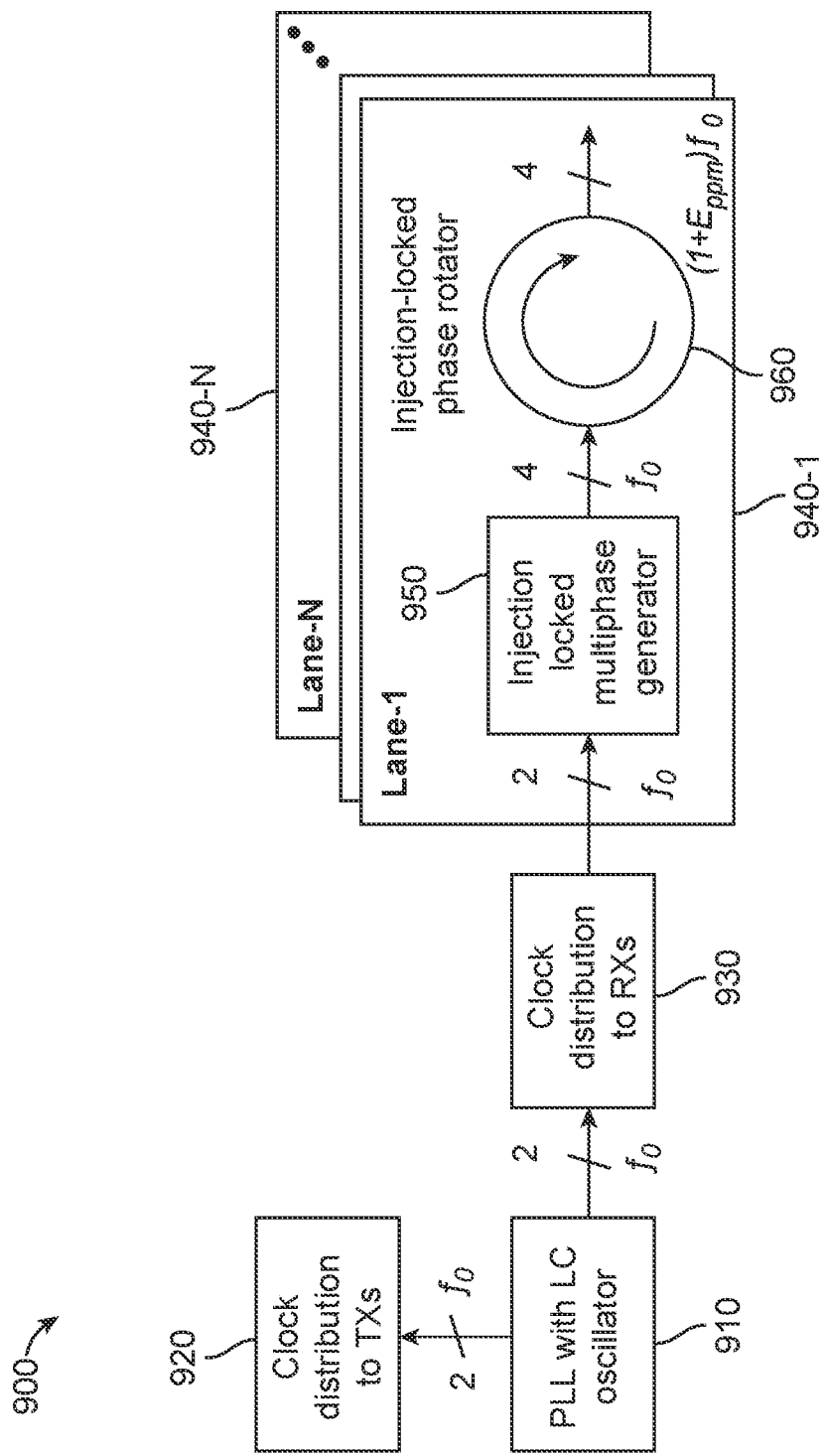
FIG. 9 is a block diagram of a system that employs the FTL apparatus in an injection locked phase rotator, according to an example embodiment.

Turning to FIG. 9, a diagram is shown of a system 900 in which the FTL 100 is used in an injection locked phase rotator. The system 900 includes a phase locked loop (PLL) with an LC oscillator 910, a block distribution block 920 for distributing clocks to transmitters, for example, and a clock distribution block 930 for distributing clocks to receivers. In the example of FIG. 9, there are N-lanes 940-1 through 940-N in a multi-lane receiver system. Each lane includes an injection locked multiphase generator 950 and an injection-locked phase rotator 960. The injection locked multiphase generator 950 and injection locked phase rotator 960 may employ the FTL apparatus 100 described above to accurately set the free-running frequency of the injection locked oscillators used in each of them. Like the system 800 in FIG. 8, a digital accumulator can be used to generate a sawtooth waveform representing the PPM frequency error information for each lane to generate output frequencies which are fractional multiples of the input frequency.

In summary, the FTL apparatus and related method presented herein considerably improves the accuracy of frequency tracking in an ILO. The replica oscillator based FLL can operate at a lower frequency when compared to the main oscillator there by saving power consumption. Since the replica oscillator and main oscillator are at different frequencies, the interaction between them is greatly reduced, which helps in reducing the spurious tones in the main oscillator output. The gain error between replica and main ILO is calibrated by adding a (voltage and/or gain) offset to the control node of the replica oscillator with non-linear gain.

The frequency pulling between replica and main ILO is reduced considerably because of the non-harmonic relationship between the two oscillators. The FTL considerably increases the frequency locking range of an ILO. The FTL algorithm is not sensitive to offset or gain error in the loop components, thereby making it robust. Moreover, the FTL can be used to calibrate the center frequency of an ILPI, DMIL oscillator.

Figure 10:
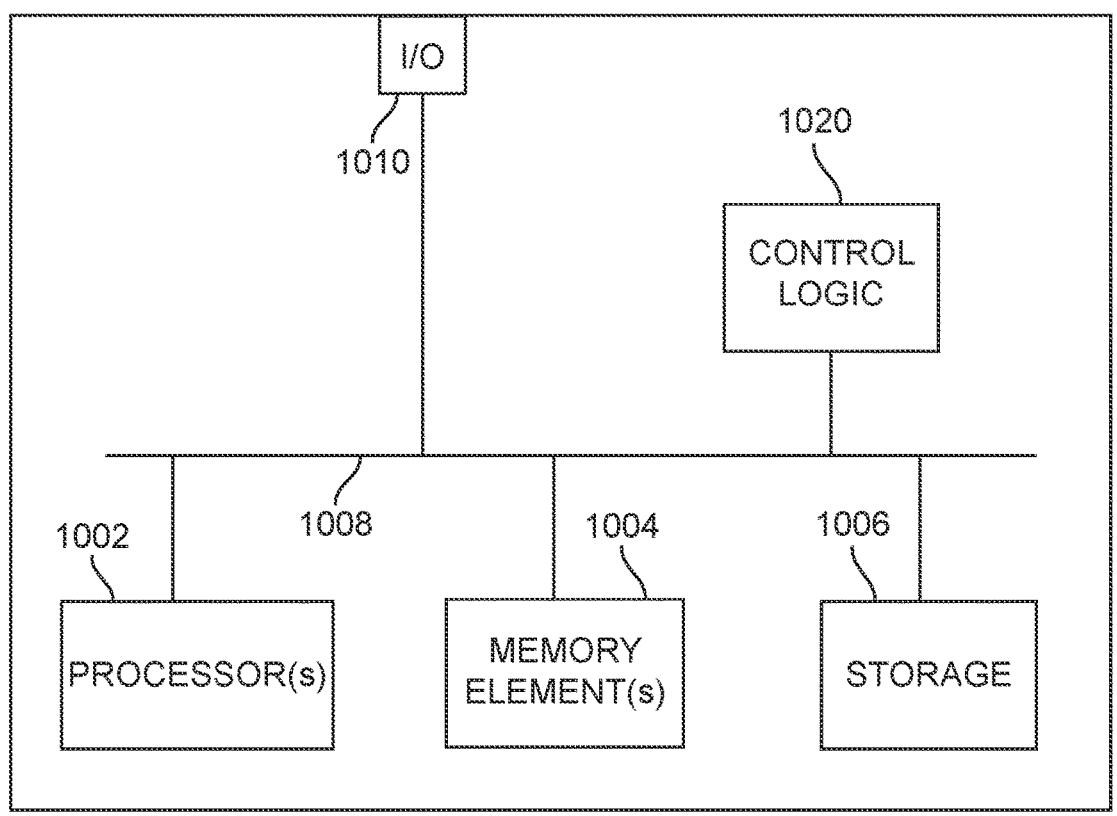
FIG. 10 is a block diagram of a computing device that may serve to perform the operations of various digital logic or computing components of the FTL apparatus, according to an example embodiment.

Referring to FIG. 10, FIG. 10 illustrates a hardware block diagram of a computing device 1000 that may be representative of the Kvco calculator 170 or processor 195 configured to perform the techniques described herein.

In at least one embodiment, the computing device 1000 may include one or more processor(s) 1002, one or more memory element(s) 1004, storage 1006, a bus 1008, one or more I/O interface(s) 1010, and control logic 1020. In various embodiments, instructions associated with logic for computing device 1000 can overlap in any manner and are not limited to the specific allocation of instructions and/or operations described herein.

In at least one embodiment, processor(s) 1002 is/are at least one hardware processor configured to execute various tasks, operations and/or functions for computing device 1000 as described herein according to software and/or instructions configured for computing device 1000. Processor(s) 1002 (e.g., a hardware processor) can execute any type of instructions associated with data to achieve the operations detailed herein. In one example, processor(s) 1002 can transform an element or an article (e.g., data, information) from one state or thing to another state or thing. Any of potential processing elements, microprocessors, digital signal processor, logic, and/or machines described herein can be construed as being encompassed within the broad term 'processor'.

In at least one embodiment, memory element(s) 1004 and/or storage 1006 is/are configured to store data, information, software, and/or instructions associated with computing device 1000, and/or logic configured for memory element(s) 1004 and/or storage 1006. For example, any logic described herein (e.g., control logic 1020) can, in various embodiments, be stored for computing device 1000 using any combination of memory element(s) 1004 and/or storage 1006. Note that in some embodiments, storage 1006 can be consolidated with memory element(s) 1004 (or vice versa), or can overlap/exist in any other suitable manner.

In at least one embodiment, bus 1008 can be configured as an interface that enables one or more elements of computing device 1000 to communicate in order to exchange information and/or data. Bus 1008 can be implemented with any architecture designed for passing control, data and/or information between processors, memory elements/storage, peripheral devices, and/or any other hardware and/or software components that may be configured for computing device 1000. In at least one embodiment, bus 1008 may be implemented as a fast kernel-hosted interconnect, potentially using shared memory between processes (e.g., logic), which can enable efficient communication paths between the processes.

In various embodiments, I/O interface(s) 1010 allow for input and output of data and/or information with other entities that may be connected to computing device 1000.

In various embodiments, control logic 1020 can include instructions that, when executed, cause processor(s) 1002 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1020) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1004 and/or storage 1006 can store data, software, code, instructions (e.g., processor instructions), logic, parameters, combinations thereof, and/or the like used for operations described herein. This includes memory element(s) 1004 and/or storage 1006 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In some aspects, an apparatus is provided including: a main oscillator having a main oscillator control input, an injection input and a main oscillator output, and configured to provide at the main oscillator output a main oscillator signal at a first frequency based on a control voltage provided at the main oscillator control input; a replica oscillator having a replica oscillator control input and a replica oscillator output, and configured to provide at the replica oscillator output a replica oscillator signal at a second frequency based on a control voltage provided at the replica oscillator control input; a first frequency detector coupled to the main oscillator output and configured to output a main oscillator frequency value that is representative of a frequency of the main oscillator signal; a second frequency detector coupled to the replica oscillator output and configured to output a replica oscillator frequency value that is representative of a frequency of the replica oscillator signal; digital logic configured to output an error value based on a difference between the main oscillator frequency value and a frequency value representative of a frequency of an injection clock signal provided at the injection input of the main oscillator; an integrator that integrates the error value over time to output an integrated error value; a digital-to-analog converter configured to convert the integrated error value to a voltage signal provided at a digital-to-analog converter output that is coupled to the main oscillator control input; and one or more circuit elements coupled between the digital-to-analog converter output and the replica oscillator control input, wherein the one or more circuit elements are configured to adjust a voltage signal or current signal used to provide the control voltage to the replica oscillator control input that causes the replica oscillator to have an oscillator gain that is exactly scaled with respect to an oscillator gain of the main oscillator, wherein an oscillator gain is a ratio of change in free-running oscillator frequency to change in control voltage.

In some aspects, the one or more circuit elements include at least one of: a variable voltage offset circuit configured to add a voltage offset value to the voltage signal output by the digital-to-analog converter; and a variable gain circuit configured to adjust a gain of the voltage signal output by the digital-to-analog converter.

In some aspects, the first frequency is not equal to the second frequency.

In some aspects, the second frequency is substantially less than the first frequency and the second frequency is not a sub-harmonic of the first frequency.

In some aspects, the apparatus further includes: a first divider coupled between the main oscillator output and an input of the first frequency detector, wherein the first divider divides a frequency of the main oscillator signal by a first divisor to provide a frequency divided main oscillator signal; and a second divider coupled between the replica oscillator output and an input of the second frequency detector, wherein the second divider divides a frequency of the replica oscillator signal by a second divisor to provide a frequency divided replica oscillator signal; wherein: the first frequency detector is configured to measure a frequency of the frequency divided main oscillator signal to produce the main oscillator frequency value; and the second frequency detector is configured to measure a frequency of the frequency divided replica oscillator signal to produce the replica oscillator frequency value.

In some aspects, the apparatus further includes: a register configured to receive as input the replica oscillator frequency value from the second frequency detector and to provide the replica oscillator frequency value at a register output in response to an enable signal; a first multiplexer having a first input coupled to the register output and a second input configured to receive a frequency value representative of the injection clock signal, wherein the first multiplexer is configured, based on a select signal, to provide at a first multiplexer output a digital value at the first input or a digital value from the second input; and a second multiplexer having a first input coupled to receive the replica oscillator frequency value and a second input coupled to receive the main oscillator frequency value, wherein the second multiplexer is configured, based on the select signal, to provide at a second multiplexer output a digital value at the first input or a digital value at the second input; wherein the digital logic is an adder that includes a first input coupled to the first multiplexer output and a second input coupled to the second multiplexer output.

In some aspects, the apparatus further includes: a computation circuit configured to receive as input the main oscillator frequency value, the replica oscillator frequency value and the error value and to generate one or more adjustment controls to the one or more circuit elements to cause the oscillator gain of the replica oscillator to be exactly scaled to the oscillator gain of the main oscillator.

In some aspects, the computation circuit is configured to: upon power up of the apparatus, initiate a frequency tuning phase by setting the enable signal to enable operation of the integrator and enable the register output to be provided to the first multiplexer, and setting a value of the select signal that causes the main oscillator to operate in a free-running mode without the injection clock signal, causes the first multiplexer to provide at the first multiplexer output the frequency value representative of the injection clock signal, and that causes the second multiplexer to provide at the second multiplexer output the main oscillator frequency value, to thereby cause the adder to output the error value that is based on a difference between the main oscillator frequency value and the frequency value representative of the injection clock signal; and when the error value is equal to zero, indicating that the main oscillator frequency value is equal to the frequency value representative of the injection clock signal, unset the enable signal to end the frequency tuning phase and start a calibration phase.

In some aspects, the computation circuit is configured, during the calibration phase, to perform a processing loop including: first storing the main oscillator frequency value output by the first frequency detector and the replica oscillator frequency value output by the second frequency detector; incrementing the digital-to-analog converter output by one least significant bit; after the incrementing, obtaining a new main oscillator frequency value output by the first frequency detector and a new replica oscillator frequency value output by the second frequency detector; second storing the new main oscillator frequency value, the new replica oscillator frequency value, a main oscillator change value based on a difference between the new main oscillator frequency value and the main oscillator frequency value, and a replica oscillator change value based on a difference between the new replica oscillator frequency value and the replica oscillator frequency value; returning the digital-to-analog converter output to a previous value; computing an oscillator gain error based on a difference between a first ratio and a second ratio, wherein the first ratio is a ratio of the new main oscillator frequency value to the new replica oscillator frequency value, and the second ratio is a ratio of the main oscillator change value to the replica oscillator change value; evaluating the oscillator gain error to determine whether it is at a minimum; as long as it is determined that the oscillator gain error is not at a minimum, causing the one or more circuit elements to change an offset or a gain of the voltage signal or current signal to produce the control voltage that is provided to the replica oscillator control input, and repeating the first storing, incrementing, obtaining, second storing, returning, computing and evaluating; and when it is determined that the oscillator gain error is at the minimum: storing values for the offset or the gain; and setting the enable signal and unsetting the select signal, thereby enabling operation of the integrator and causing storing of the new replica oscillator frequency value from a latest iteration of the processing loop to be stored in the register, and such that the main oscillator is out of the free-running running mode and operates like an injection locked oscillator based on the injection clock signal and the voltage signal provided at the output of the digital-to-analog converter tracks voltage and temperature variations of the replica oscillator which reflects the voltage and temperature variations of the main oscillator.

In some aspects, a method is provided including: obtaining a main oscillator signal from a main oscillator at a first frequency based on a control voltage provided at a main oscillator control input; obtaining a replica oscillator signal from a replica oscillator at a second frequency based on a control voltage provided at a replica oscillator control input; detecting a frequency of the main oscillator signal to provide a main oscillator frequency value that is representative of the frequency of the main oscillator signal; detecting a frequency of the replica oscillator signal to provide a replica oscillator frequency value that is representative of the frequency of the replica oscillator signal; generating an error value based on a difference between the main oscillator frequency value and a frequency value representative of a frequency of an injection clock signal provided to the main oscillator; converting the error value to a voltage signal that is coupled to the main oscillator control input; and adjusting a voltage signal or current signal to provide a control voltage to the replica oscillator control input that causes the replica oscillator to have an oscillator gain that is exactly scaled with respect to an oscillator gain of the main oscillator, wherein an oscillator gain is a ratio of change in free-running oscillator frequency to change in control voltage.

In some aspects, adjusting includes adjusting at least one of: a voltage offset value to the voltage signal; and a gain of the voltage signal.

In some aspects, the method further includes: dividing a frequency of the main oscillator signal by a first divisor to provide a frequency divided main oscillator signal; dividing a frequency of the replica oscillator signal by a second divisor to provide a frequency divided replica oscillator signal; wherein: detecting a frequency of the main oscillator signal includes detecting a frequency of the frequency divided main oscillator signal to produce the main oscillator frequency value; and detecting a frequency of the replica oscillator signal includes detecting a frequency of the frequency divided replica oscillator signal to produce the replica oscillator frequency value.

In some aspects, the method further includes: generating one or more adjustment controls used for the adjusting to cause the oscillator gain of the replica oscillator to be exactly scaled to the oscillator gain of the main oscillator.

In some aspects, the method further includes: upon power up, initiating a frequency tuning phase during which the main oscillator is permitted to run; when the main oscillator frequency value is equal to the frequency value representative of the frequency of the injection clock signal, terminating the frequency tuning phase and initiating a calibration phase; and during the calibration phase, perform a processing loop including: first storing the main oscillator frequency value and the replica oscillator frequency value; incrementing by one least significant bit a digital-to-analog converter output that is used to perform the converting of the error value to the voltage signal; after the incrementing, obtaining a new main oscillator frequency value and a new replica oscillator frequency value; second storing the new main oscillator frequency value, the new replica oscillator frequency value, a main oscillator change value based on a difference between the new main oscillator frequency value and the main oscillator frequency value, and a replica oscillator change value based on a difference between the new replica oscillator frequency value and the replica oscillator frequency value; returning the digital-to-analog converter output to a previous value; computing an oscillator gain error based on a difference between a first ratio and a second ratio, wherein the first ratio is a ratio of the new main oscillator frequency value to the new replica oscillator frequency value, and the second ratio is a ratio of the main oscillator change value to the replica oscillator change value; evaluating the oscillator gain error to determine whether it is at a minimum; as long as it is determined that the oscillator gain error is not at a minimum, adjusting an offset or a gain applied to the voltage signal or current signal to produce the control signal that is provided to the replica oscillator control input, and repeating the first storing, incrementing, obtaining, second storing, returning, computing and evaluating; and when it is determined that the oscillator gain error is at the minimum: storing values for the offset or the gain; and storing of the new replica oscillator frequency value from a latest iteration of the processing loop, and such that the main oscillator is out of a free-running running mode and operates like an injection locked oscillator based on the injection clock signal, and the voltage signal provided at the output of the digital-to-analog converter tracks voltage and temperature variations of the replica oscillator which reflects the voltage and temperature variations of the main oscillator.

In some aspects, an apparatus is provided comprising: a main oscillator having a main oscillator control input, an injection input and a main oscillator output, and configured to provide at the main oscillator output a main oscillator signal at a first frequency based on a control voltage provided at the main oscillator control input; a replica oscillator having a replica oscillator control input and a replica oscillator output, and configured to provide at the replica oscillator output a replica oscillator signal at a second frequency based on a control voltage provided at the replica oscillator control input; a first frequency detector coupled to the main oscillator output and configured to output a main oscillator frequency value that is representative of a frequency of the main oscillator signal; a second frequency detector coupled to the replica oscillator output and configured to output a replica oscillator frequency value that is representative of a frequency of the replica oscillator signal; a processor configured to generate an error value based on a difference between the main oscillator frequency value and a frequency value representative of a frequency of an injection clock signal provided at the injection input of the main oscillator, and to integrate the error value over time to output an integrated error value; a digital-to-analog converter configured to convert the integrated error value to a voltage signal provided at a digital-to-analog converter output that is coupled to the main oscillator control input; and one or more circuit elements coupled between the digital-to-analog converter output and the replica oscillator control input, wherein the one or more circuit elements are configured to adjust a voltage signal or current signal used to provide a control voltage to the replica oscillator control input that causes the replica oscillator to have an oscillator gain that is exactly scaled with respect to an oscillator gain of the main oscillator, wherein an oscillator gain is a ratio of change in free-running oscillator frequency to change in control voltage.

In some aspects, the processor is further configured to: upon power up, initiate a frequency tuning phase during which the main oscillator is permitted to run; when the main oscillator frequency value is equal to the frequency value representative of the frequency of the injection clock signal, terminate the frequency tuning phase and initiating a calibration phase; and during the calibration phase, perform a processing loop including: first storing the main oscillator frequency value and the replica oscillator frequency value; incrementing by one least significant bit a digital-to-analog converter output that is used to convert the error value to the voltage signal; after the incrementing, obtaining a new main oscillator frequency value and a new replica oscillator frequency value; second storing the new main oscillator frequency value, the new replica oscillator frequency value, a main oscillator change value based on a difference between the new main oscillator frequency value and the main oscillator frequency value, and a replica oscillator change value based on a difference between the new replica oscillator frequency value and the replica oscillator frequency value; returning the digital-to-analog converter output to a previous value; computing an oscillator gain error based on a difference between a first ratio and a second ratio, wherein the first ratio is a ratio of the new main oscillator frequency value to the new replica oscillator frequency value, and the second ratio is a ratio of the main oscillator change value to the replica oscillator change value; evaluating the oscillator gain error to determine whether it is at a minimum; as long as it is determined that the oscillator gain error is not at a minimum, adjusting an offset or a gain applied to the voltage signal or current signal to produce the control signal that is provided to the replica oscillator control input, and repeating the first storing, incrementing, obtaining, second storing, returning, computing and evaluating; and when it is determined that the oscillator gain error is at the minimum: storing values for the offset or the gain; and storing of the new replica oscillator frequency value from a latest iteration of the processing loop, and such that the main oscillator is out of a free-running running mode and operates like an injection locked oscillator based on the injection clock signal, and the voltage signal provided at the output of the digital-to-analog converter tracks voltage and temperature variations of the replica oscillator which reflects the voltage and temperature variations of the main oscillator.

In some aspects, the one or more circuit elements include at least one of: a variable voltage offset circuit configured to add a voltage offset value to the voltage signal output by the digital-to-analog converter; and a variable gain circuit configured to adjust a gain of the voltage signal output by the digital-to-analog converter.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
    a main oscillator having a main oscillator control input, an injection input and a main oscillator output, and configured to provide at the main oscillator output a main oscillator signal at a first frequency based on a control voltage provided at the main oscillator control input;
    a replica oscillator having a replica oscillator control input and a replica oscillator output, and configured to provide at the replica oscillator output a replica oscillator signal at a second frequency based on a control voltage provided at the replica oscillator control input;
    a first frequency detector coupled to the main oscillator output and configured to output a main oscillator frequency value that is representative of a frequency of the main oscillator signal;
    a second frequency detector coupled to the replica oscillator output and configured to output a replica oscillator frequency value that is representative of a frequency of the replica oscillator signal; and
    one or more circuit elements coupled to the replica oscillator control input, wherein the one or more circuit elements are configured to adjust a voltage signal or current signal used to provide the control voltage to the replica oscillator control input based on a difference between the main oscillator frequency value and a frequency value representative of a frequency of an injection clock signal provided at the injection input of the main oscillator, wherein the control voltage causes the replica oscillator to have an oscillator gain that is scaled with respect to an oscillator gain of the main oscillator, wherein an oscillator gain is a ratio of change in free-running oscillator frequency to change in control voltage.

2. The apparatus of claim 1, wherein the one or more circuit elements include at least one of:
    a variable voltage offset circuit configured to add a voltage offset value to the control voltage; and
    a variable gain circuit configured to adjust a gain of the control voltage.

3. The apparatus of claim 1, wherein the first frequency is not equal to the second frequency.

4. The apparatus of claim 3, wherein the second frequency is substantially less than the first frequency and the second frequency is not a sub-harmonic of the first frequency.

5. The apparatus of claim 1, further comprising:
    a first divider coupled between the main oscillator output and an input of the first frequency detector, wherein the first divider divides a frequency of the main oscillator signal by a first divisor to provide a frequency divided main oscillator signal; and
    a second divider coupled between the replica oscillator output and an input of the second frequency detector, wherein the second divider divides a frequency of the replica oscillator signal by a second divisor to provide a frequency divided replica oscillator signal;
    wherein:
    the first frequency detector is configured to measure a frequency of the frequency divided main oscillator signal to produce the main oscillator frequency value; and
    the second frequency detector is configured to measure a frequency of the frequency divided replica oscillator signal to produce the replica oscillator frequency value.

6. The apparatus of claim 5, further comprising:
    a register configured to receive as input the replica oscillator frequency value from the second frequency detector and to provide the replica oscillator frequency value at a register output in response to an enable signal;
    a first multiplexer having a first input coupled to the register output and a second input configured to receive a frequency value representative of the injection clock signal, wherein the first multiplexer is configured, based on a select signal, to provide at a first multiplexer output a digital value at the first input or a digital value from the second input;
    a second multiplexer having a first input coupled to receive the replica oscillator frequency value and a second input coupled to receive the main oscillator frequency value, wherein the second multiplexer is configured, based on the select signal, to provide at a second multiplexer output a digital value at the first input or a digital value at the second input; and
    an adder that includes a first input coupled to the first multiplexer output and a second input coupled to the second multiplexer output.

7. The apparatus of claim 6, further comprising:
    a computation circuit configured to receive as input the main oscillator frequency value, the replica oscillator frequency value and an error value that is based on the difference between the main oscillator frequency value and the frequency value representative of a frequency of an injection clock signal provided at the injection input of the main oscillator, and to generate one or more adjustment controls to the one or more circuit elements to cause the oscillator gain of the replica oscillator to be scaled to the oscillator gain of the main oscillator.

8. The apparatus of claim 7, wherein the computation circuit is configured to:
    upon power up of the apparatus, initiate a frequency tuning phase by setting the enable signal to enable the register output to be provided to the first multiplexer, and setting a value of the select signal that causes the main oscillator to operate in a free-running mode without the injection clock signal, causes the first multiplexer to provide at the first multiplexer output the frequency value representative of the injection clock signal, and that causes the second multiplexer to provide at the second multiplexer output the main oscillator frequency value, wherein the error value is based on a difference between the main oscillator frequency value and the frequency value representative of the injection clock signal; and
    when the error value is equal to zero, indicating that the main oscillator frequency value is equal to the frequency value representative of the injection clock signal, unset the enable signal to end the frequency tuning phase and start a calibration phase.

9. The apparatus of claim 8, wherein the computation circuit is configured, during the calibration phase, to perform a processing loop comprising:
  first storing the main oscillator frequency value output by the first frequency detector and the replica oscillator frequency value output by the second frequency detector;
  incrementing a digital-to-analog converter output by one least significant bit;
  after the incrementing, obtaining a new main oscillator frequency value output by the first frequency detector and a new replica oscillator frequency value output by the second frequency detector;
  second storing the new main oscillator frequency value, the new replica oscillator frequency value, a main oscillator change value based on a difference between the new main oscillator frequency value and the main oscillator frequency value, and a replica oscillator change value based on a difference between the new replica oscillator frequency value and the replica oscillator frequency value;
  returning the digital-to-analog converter output to a previous value;
  computing an oscillator gain error based on a difference between a first ratio and a second ratio, wherein the first ratio is a ratio of the new main oscillator frequency value to the new replica oscillator frequency value, and the second ratio is a ratio of the main oscillator change value to the replica oscillator change value;
  evaluating the oscillator gain error to determine whether it is at a minimum;
  as long as it is determined that the oscillator gain error is not at a minimum, causing the one or more circuit elements to change an offset or a gain of the voltage signal or current signal to produce the control voltage that is provided to the replica oscillator control input, and repeating the first storing, incrementing, obtaining, second storing, returning, computing and evaluating; and
  when it is determined that the oscillator gain error is at the minimum:
    storing values for the offset or the gain; and
    setting the enable signal and unsetting the select signal, thereby causing storing of the new replica oscillator frequency value from a latest iteration of the processing loop to be stored in the register, and such that the main oscillator is out of the free-running running mode and operates like an injection locked oscillator based on the injection clock signal and the voltage signal provided at the output of the digital-to-analog converter tracks voltage and temperature variations of the replica oscillator which reflects the voltage and temperature variations of the main oscillator.

10. A method comprising:
  obtaining a main oscillator signal from a main oscillator at a first frequency based on a control voltage provided at a main oscillator control input;
  obtaining a replica oscillator signal from a replica oscillator at a second frequency based on a control voltage provided at a replica oscillator control input;
  detecting a frequency of the main oscillator signal to provide a main oscillator frequency value that is representative of the frequency of the main oscillator signal;
  detecting a frequency of the replica oscillator signal to provide a replica oscillator frequency value that is representative of the frequency of the replica oscillator signal; and
  adjusting a voltage signal or current signal to provide a control voltage to the replica oscillator control input based on a difference between the main oscillator frequency value and a frequency value representative of a frequency of an injection clock signal provided to the main oscillator, wherein the control voltage causes the replica oscillator to have an oscillator gain that is scaled with respect to an oscillator gain of the main oscillator, wherein an oscillator gain is a ratio of change in free-running oscillator frequency to change in control voltage.

11. The method of claim 10, wherein adjusting comprises adjusting at least one of:
  a voltage offset value to the voltage signal; and
  a gain of the voltage signal.

12. The method of claim 10, wherein the first frequency is not equal to the second frequency.

13. The method of claim 12, wherein the second frequency is substantially less than the first frequency and the second frequency is not a sub-harmonic of the first frequency.

14. The method of claim 10, further comprising:
  dividing a frequency of the main oscillator signal by a first divisor to provide a frequency divided main oscillator signal; and
  dividing a frequency of the replica oscillator signal by a second divisor to provide a frequency divided replica oscillator signal;
  wherein:
  detecting a frequency of the main oscillator signal comprises detecting a frequency of the frequency divided main oscillator signal to produce the main oscillator frequency value; and
  detecting a frequency of the replica oscillator signal comprises detecting a frequency of the frequency divided replica oscillator signal to produce the replica oscillator frequency value.

15. The method of claim 14, further comprising:
  generating one or more adjustment controls used for the adjusting to cause the oscillator gain of the replica oscillator to be scaled to the oscillator gain of the main oscillator.

16. The method of claim 15, further comprising:
  upon power up, initiating a frequency tuning phase during which the main oscillator is permitted to run;
  when the main oscillator frequency value is equal to the frequency value representative of the frequency of the injection clock signal, terminating the frequency tuning phase and initiating a calibration phase; and
  during the calibration phase, perform a processing loop comprising:
    first storing the main oscillator frequency value and the replica oscillator frequency value;
    incrementing by one least significant bit a digital-to-analog converter output that is used to convert an error value to the voltage signal, wherein the error value is based on the difference between the main oscillator frequency value and the frequency value representative of a frequency of an injection clock signal provided to the main oscillator;
    after the incrementing, obtaining a new main oscillator frequency value and a new replica oscillator frequency value;

second storing the new main oscillator frequency value, the new replica oscillator frequency value, a main oscillator change value based on a difference between the new main oscillator frequency value and the main oscillator frequency value, and a replica oscillator change value based on a difference between the new replica oscillator frequency value and the replica oscillator frequency value;

returning the digital-to-analog converter output to a previous value;

computing an oscillator gain error based on a difference between a first ratio and a second ratio, wherein the first ratio is a ratio of the new main oscillator frequency value to the new replica oscillator frequency value, and the second ratio is a ratio of the main oscillator change value to the replica oscillator change value;

evaluating the oscillator gain error to determine whether it is at a minimum;

as long as it is determined that the oscillator gain error is not at a minimum, adjusting an offset or a gain applied to the voltage signal or current signal to produce a control signal that is provided to the replica oscillator control input, and repeating the first storing, incrementing, obtaining, second storing, returning, computing and evaluating; and when it is determined that the oscillator gain error is at the minimum:

storing values for the offset or the gain; and storing of the new replica oscillator frequency value from a latest iteration of the processing loop, and such that the main oscillator is out of a free-running running mode and operates like an injection locked oscillator based on the injection clock signal, and the voltage signal provided at the output of the digital-to-analog converter tracks voltage and temperature variations of the replica oscillator which reflects the voltage and temperature variations of the main oscillator.

17. An apparatus comprising:

a main oscillator having a main oscillator control input, an injection input and a main oscillator output, and configured to provide at the main oscillator output a main oscillator signal at a first frequency based on a control voltage provided at the main oscillator control input;

a replica oscillator having a replica oscillator control input and a replica oscillator output, and configured to provide at the replica oscillator output a replica oscillator signal at a second frequency based on a control voltage provided at the replica oscillator control input;

a first frequency detector coupled to the main oscillator output and configured to output a main oscillator frequency value that is representative of a frequency of the main oscillator signal;

a second frequency detector coupled to the replica oscillator output and configured to output a replica oscillator frequency value that is representative of a frequency of the replica oscillator signal;

a processor configured to generate an error value based on a difference between the main oscillator frequency value and a frequency value representative of a frequency of an injection clock signal provided at the injection input of the main oscillator, and to integrate the error value over time to output an integrated error value;

a digital-to-analog converter configured to convert the integrated error value to a voltage signal provided at a digital-to-analog converter output that is coupled to the main oscillator control input; and one or more circuit elements coupled between the digital-to-analog converter output and the replica oscillator control input, wherein the one or more circuit elements are configured to adjust a voltage signal or current signal used to provide a control voltage to the replica oscillator control input that causes the replica oscillator to have an oscillator gain that is scaled with respect to an oscillator gain of the main oscillator, wherein an oscillator gain is a ratio of change in free-running oscillator frequency to change in control voltage.

18. The apparatus of claim 17, where the processor is further configured to:

upon power up, initiate a frequency tuning phase during which the main oscillator is permitted to run;

when the main oscillator frequency value is equal to the frequency value representative of the frequency of the injection clock signal, terminate the frequency tuning phase and initiating a calibration phase; and during the calibration phase, perform a processing loop comprising:

first storing the main oscillator frequency value and the replica oscillator frequency value;

incrementing by one least significant bit a digital-to-analog converter output that is used to convert the error value to the voltage signal;

after the incrementing, obtaining a new main oscillator frequency value and a new replica oscillator frequency value;

second storing the new main oscillator frequency value, the new replica oscillator frequency value, a main oscillator change value based on a difference between the new main oscillator frequency value and the main oscillator frequency value, and a replica oscillator change value based on a difference between the new replica oscillator frequency value and the replica oscillator frequency value;

returning the digital-to-analog converter output to a previous value;

computing an oscillator gain error based on a difference between a first ratio and a second ratio, wherein the first ratio is a ratio of the new main oscillator frequency value to the new replica oscillator frequency value, and the second ratio is a ratio of the main oscillator change value to the replica oscillator change value;

evaluating the oscillator gain error to determine whether it is at a minimum;

as long as it is determined that the oscillator gain error is not at a minimum, adjusting an offset or a gain applied to the voltage signal or current signal to produce the control signal that is provided to the replica oscillator control input, and repeating the first storing, incrementing, obtaining, second storing, returning, computing and evaluating; and when it is determined that the oscillator gain error is at the minimum:

storing values for the offset or the gain; and storing of the new replica oscillator frequency value from a latest iteration of the processing loop, and such that the main oscillator is out of a free-running running mode and operates like an injection locked oscillator based on the injection clock signal, and the voltage signal provided at the output of the digital-to-analog converter tracks voltage and temperature variations of the replica oscillator which reflects the voltage and temperature variations of the main oscillator.

19. The apparatus of claim 17, wherein the one or more circuit elements include at least one of:
- a variable voltage offset circuit configured to add a voltage offset value to the voltage signal output by the digital-to-analog converter; and
- a variable gain circuit configured to adjust a gain of the voltage signal output by the digital-to-analog converter.

20. The apparatus of claim 17, wherein the first frequency is not equal to the second frequency.

* * * * *